(12) United States Patent
Fortier

(10) Patent No.: US 11,094,973 B2
(45) Date of Patent: Aug. 17, 2021

(54) EMBEDDED SENSORS FOR IN-SITU CELL MONITORING OF BATTERIES

(71) Applicant: Aleksandra Fortier, Coppell, TX (US)

(72) Inventor: Aleksandra Fortier, Coppell, TX (US)

( * ) Notice: Subject to any disclaimer, the term of this patent is extended or adjusted under 35 U.S.C. 154(b) by 0 days.

(21) Appl. No.: 16/826,850

(22) Filed: Mar. 23, 2020

(65) Prior Publication Data

US 2020/0328480 A1 Oct. 15, 2020

Related U.S. Application Data

(62) Division of application No. 15/707,120, filed on Sep. 18, 2017, now abandoned.

(60) Provisional application No. 62/502,946, filed on May 8, 2017.

(51) Int. Cl.
| | |
|---|---|
| *G01R 31/382* | (2019.01) |
| *G01R 31/392* | (2019.01) |
| *G01R 31/36* | (2020.01) |
| *G01R 31/3835* | (2019.01) |
| *H01M 10/48* | (2006.01) |
| *H01M 10/42* | (2006.01) |

(52) U.S. Cl.
CPC ......... *H01M 10/48* (2013.01); *H01M 10/486* (2013.01); *G01R 31/3835* (2019.01); *G01R 31/392* (2019.01); *H01M 2010/4278* (2013.01)

(58) Field of Classification Search
None
See application file for complete search history.

(56) References Cited

U.S. PATENT DOCUMENTS

| | | |
|---|---|---|
| 9,588,001 B2 | 3/2017 | Chiang et al. |
| 2004/0228594 A1 | 11/2004 | Andre et al. |
| 2009/0140870 A1 | 6/2009 | Densham |
| 2010/0124250 A1 | 5/2010 | Lachenmeier et al. |
| 2015/0023389 A1 | 1/2015 | Imaoka et al. |
| 2016/0028129 A1 | 1/2016 | Raghavan et al. |

*Primary Examiner* — Yoshitoshi Takeuchi
(74) *Attorney, Agent, or Firm* — David W. Carstens; James H. Ortega; Carstens & Cahoon, LLP

(57) ABSTRACT

The disclosed principles provide for techniques for the 3D fabrication of sensing systems that are embedded inside battery cells and provide cell parameter data for a comprehensive and an robust battery management system. The disclosed principles provide for online and real-time monitoring of battery state-of-health down to the individual cell level of each battery using embedded sensors on one or more of the internal layers of a cell, such as the dielectric separators found in such battery cells. The implementation of the disclosed principles in individual battery cells therefore provides an increased likelihood to mitigate catastrophic failures in batteries. In addition, the disclosed fabrication processes for printing sensors directly on one or more of the components or layers within each individual battery cell, significantly reduce manufacturing steps required by conventional battery management systems. The disclosed principles also provided for a unique silica-based ink for use in the 3D printing of such embedded cell sensing components.

17 Claims, 14 Drawing Sheets

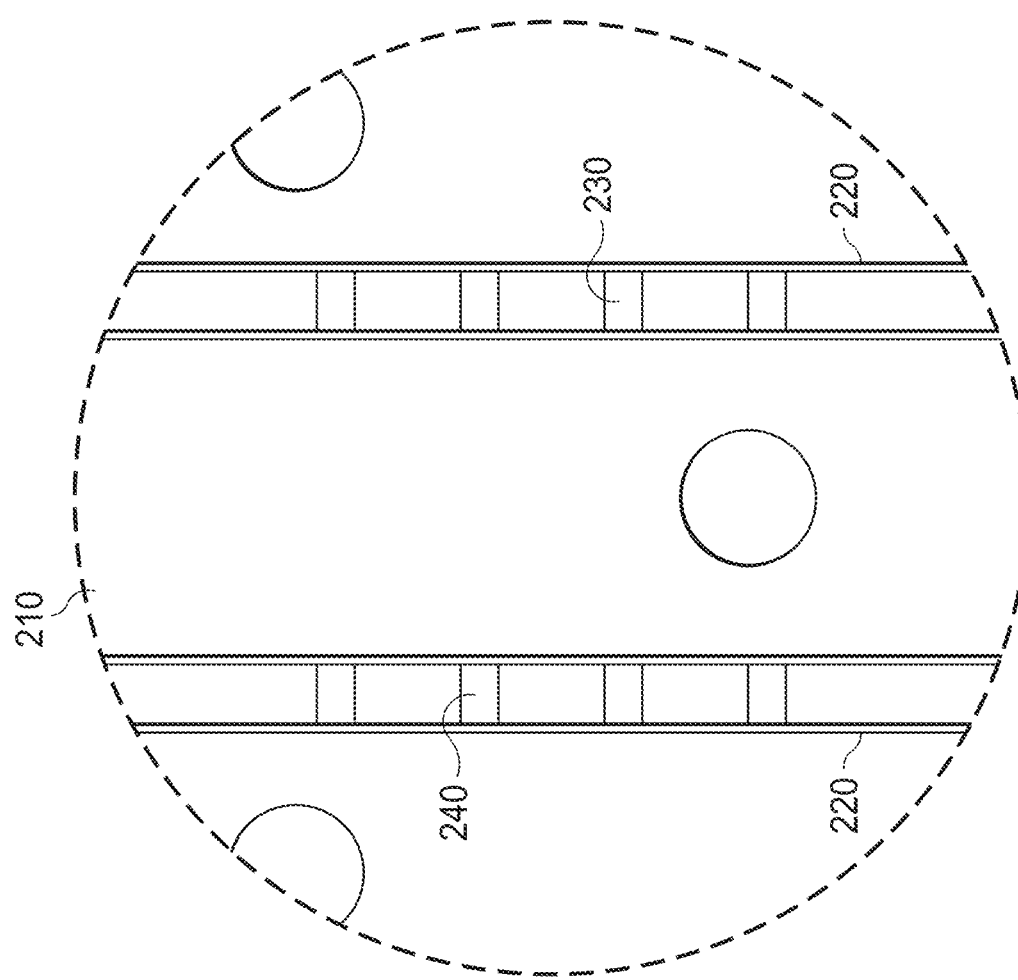
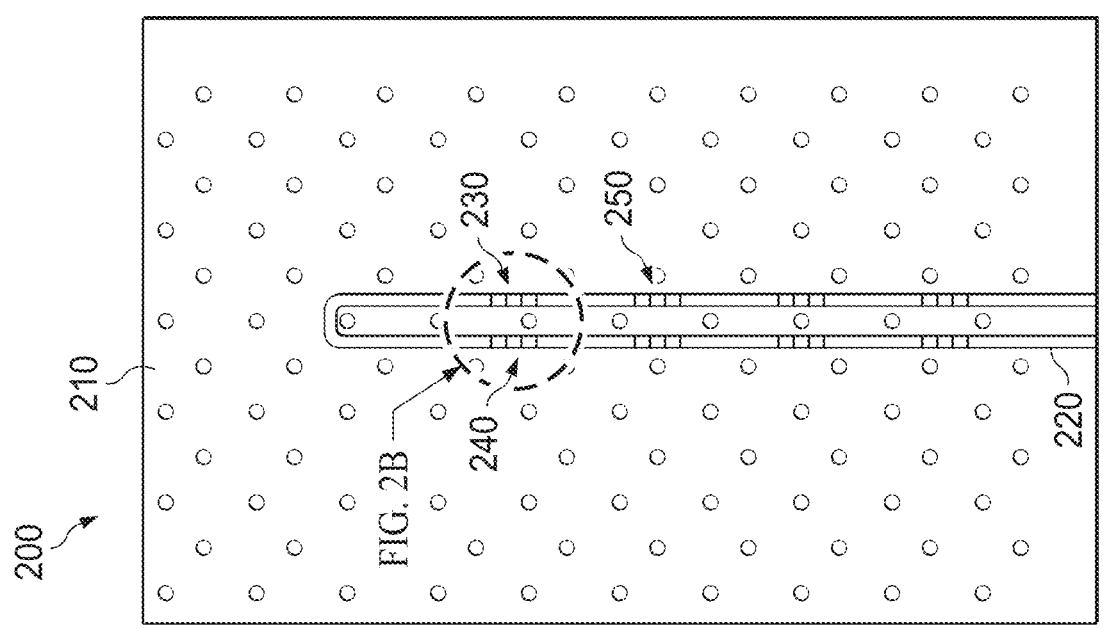
FIG. 2B
FIG. 2A

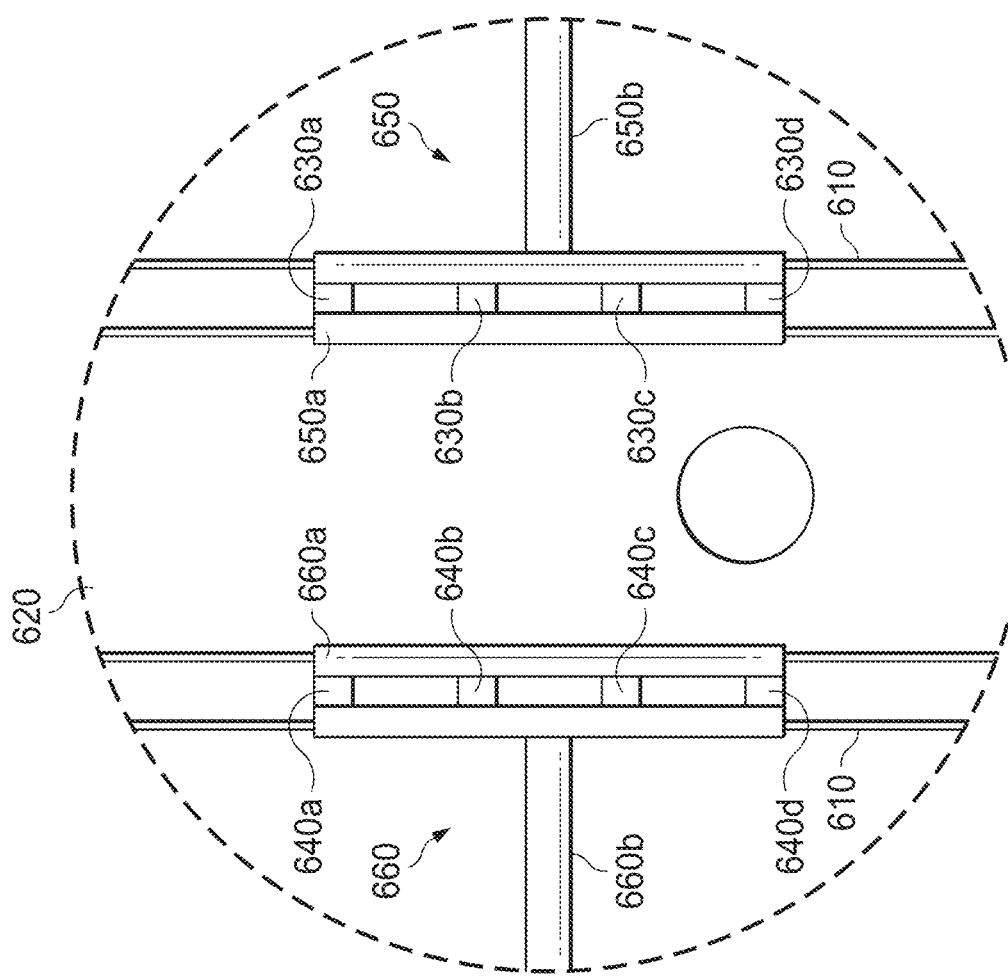
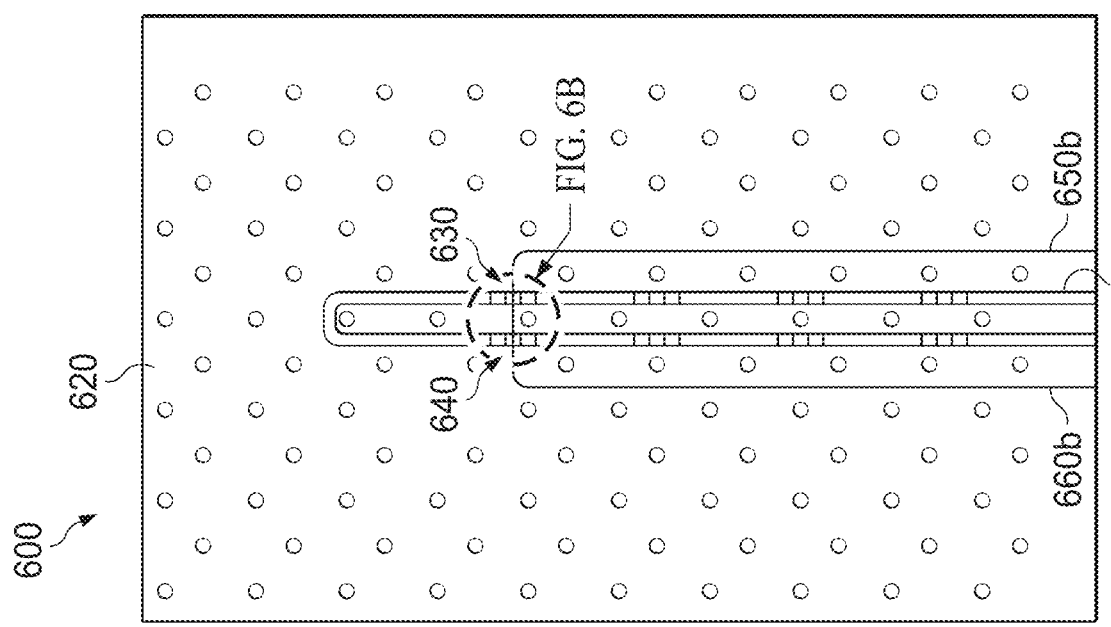
FIG. 6B
FIG. 6A

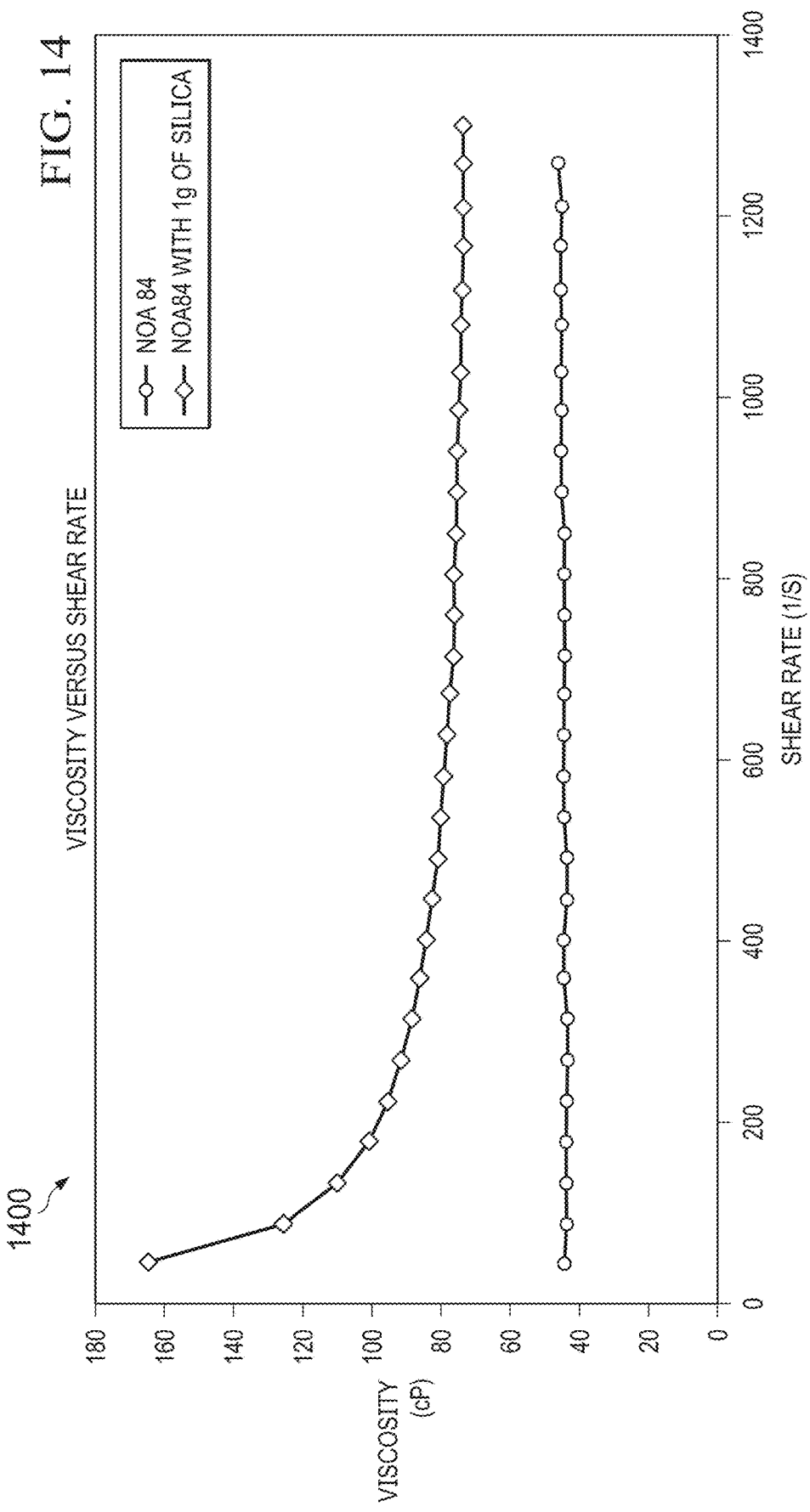

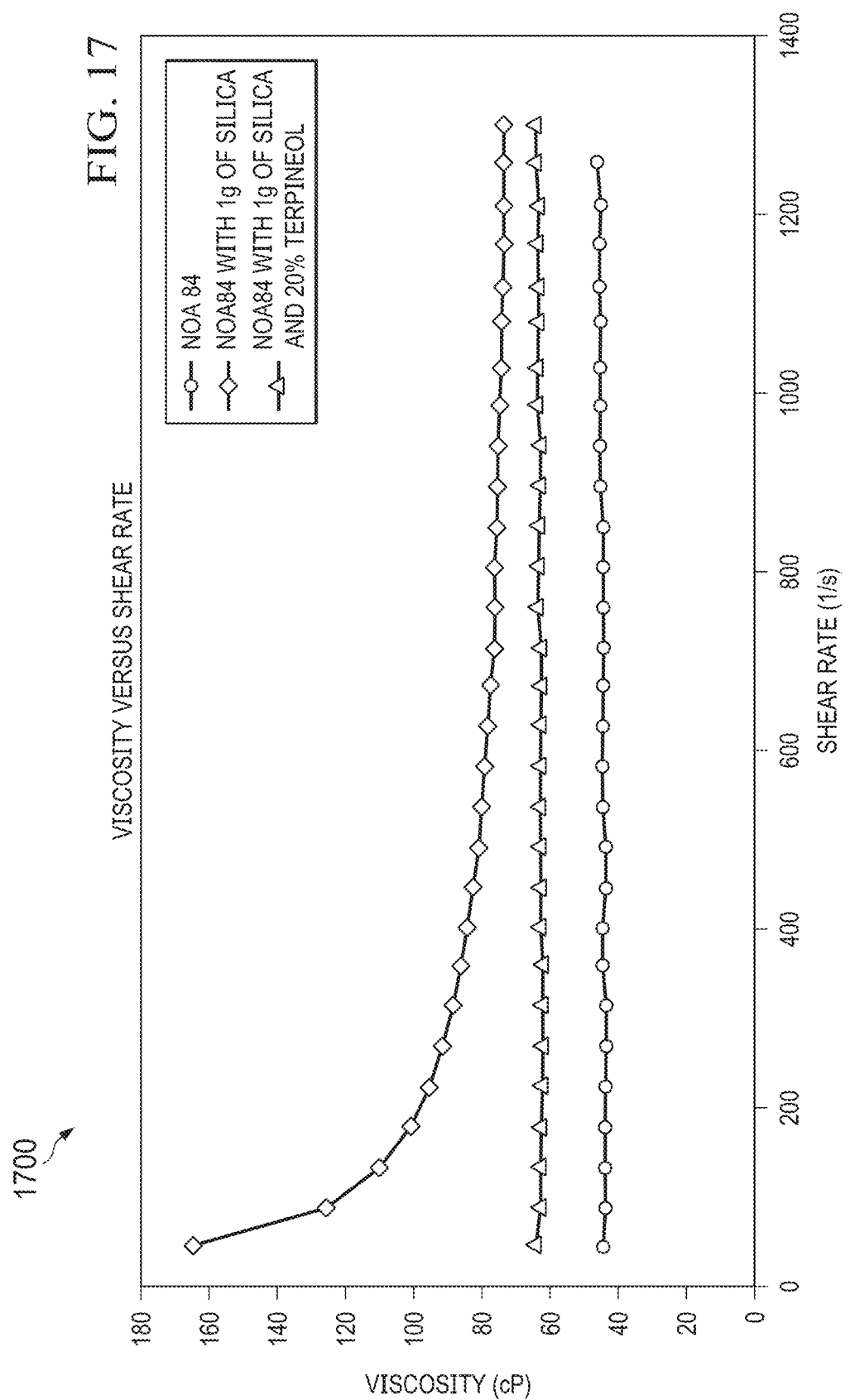

EMBEDDED SENSORS FOR IN-SITU CELL MONITORING OF BATTERIES

PRIORITY CLAIM

The present disclosure is a divisional of U.S. application Ser. No. 15/707,120, filed Sep. 18, 2017, which is a nonprovisional conversion of, and thus claims priority to, U.S. Provisional Patent Application Ser. No. 62/502,946, filed May 8, 2017, the contents of which are incorporated herein by reference for all purposes.

STATEMENT REGARDING FEDERALLY SPONSORED RESEARCH OR DEVELOPMENT

This invention was made with government support under Contract No. FA8650-12-D-2224 awarded by the Intellectual Property Law Division of the Department of the Air Force. The government has certain rights in the invention.

TECHNICAL FIELD

The present disclosure relates to battery management sensors and systems, and in particular to a unique technique for embedding sensors in battery cells for in-situ monitoring of individual cell state-of-health.

BACKGROUND

Rechargeable lithium-based batteries currently have the highest energy densities available on the market, and recent advancements in materials have also made them the most reliable. As such, the Li-ion battery (LIB) has become the most popular choice of energy-storage device for many applications, such as cellular phones, mobile computers, medical, aerospace and military devices, and is currently the lead contender to power all electric cars. Batteries are also the primary energy source for aircraft power and operation where monitoring energy storage, usage, and potential failures is critical to all operations of the aircraft and even direct energy weapons (DEWs).

To support consumer needs, many of these electronic applications require rechargeable or secondary batteries that can offer long cycle life, high volumetric and gravimetric energy densities, and high power capabilities. Thus, there is also a significant need to estimate and understand a battery's state of charge and state of health. As an electrochemical product, a battery acts differently under different operational and environmental conditions. The uncertainty of a battery's performance poses a challenge to the implementation of these functions. There are a few battery management systems (BMS) currently available on the market, but conventional BMSs do not provide adequate or enough information in real time to mitigate all failures in time. This is the case because existing BMSs do not report all parameters at the cell-level.

Typically, battery monitoring is performed by sampling external temperature and electrical properties, such as current and voltage, over the external battery terminals with one measurement made per group of 10 or more cells. The problem with existing BMSs is lack of reporting parameters at the individual cell-level which is crucial for good cell performance and long life cycle of the battery pack. For example, aircraft battery packs are typically composed of several hundreds of cells, which in turn provides several hundreds of cell failure opportunities, and therefore having the ability to monitor battery health at the cell-level is crucial to ensure operational safety and efficiency. Also, aircraft batteries will undergo different operational modes than those in typical portable electronics. For instance, as the aircraft is used in the open air, the batteries are subjected to damage from alternating temperature, not only during cell operation but also during storage. Pressure and strain are also much more prevalent for aircraft batteries due to their environmental exposure. As cells undergo charging and discharging cycles, performance changes take place and integration of smart monitoring at the cell-level is critical to ensure operational safety and efficiency in such battery packs that are composed of several hundred cells Several common functions of three popular commercial BMSs are summarized below in Table 1.

TABLE 1

| Measured Parameters | BMS by Maxim Integrated [3] | BMS by Texas Instruments [4] | BMS by O2Micro International UK [5] |
| --- | --- | --- | --- |
| Voltage | At Cell-Level | At Cell-Level | At Cell-Level |
| Temperature | No | At Cell-Level | At Pack-Level |
| State of Charge (SOC) | No | Yes | Yes |
| State of Health (SOH) | No | No | No |
| Current | At Cell-Level | At Cell-Level | At Cell-Level |
| Data Logging | None | On PC-Based GUI Only | EEPROM |

From Table 1, common disadvantages can be noted in the current commercial BMS solutions. Lack of monitoring temperature, SOC and SOH across all levels starting from cell-level and limited data logging function. Monitoring temperature at cell-level is essential to prevent overheating of battery pack, SOH is supposed to show current health status and the remaining performance of the battery that will ensure operational safety of the aircraft and scheduled maintenance for battery replacement, and limited data logging which typically traces the cycling pattern of the battery that can assist in monitoring SOC in real time. To meet the future challenges of energy storage, a new generation of Li-ion batteries with excellent performance, long cycle life, safety and reliability are needed not only for applications in consumer electronics, but especially for clean energy storage and use in all electric and aerospace applications.

In an effort to mitigate abnormal increases in temperature and/or pressure (i.e., "thermal runaway") in batteries and increase their reliability, several conventional approaches have been attempted. For example, conventional approaches have included embedded commercial reaction temperature sensors (RTS) to improve battery safety, the implementation of micro-temperature and voltage sensors into li-ion batteries where sensors are fabricated using micro-electro-mechanical systems (MEMS) technology, the monitoring of internal battery health through a polymer or copper coated bifunctional separator serving as third sensing terminal in addition to the cathode and anode, and the creation of more accurate battery management systems by implementing commercial internal sensing devices. However, while each of these conventional approaches may be partially beneficial, they require lengthy implementation and fabrication processes, and are limited to monitoring only certain battery state-of-health parameters. Indeed, not a single conventional sensing technology is capable of simultaneously outputting data for multiple parameters in real time to increase the overall accuracy of each cell's state-of-health.

Accordingly, there is a need in the art for a battery cell sensing technology capable of providing data for multiple battery state-of-health parameters, but which does not suffer from the deficiencies of conventional approaches. The present disclosure provides such a solution.

SUMMARY

To overcome the deficiencies of the prior art, the disclosed principles provide for techniques for the 3D fabrication of sensing systems that are embedded inside battery cells and provide cell parameter data for a comprehensive and an robust BMS. The disclosed principles provide for online and real-time monitoring of battery state-of-health down to the individual cell level of each battery using embedded sensors on one or more of the internal layers of a cell, such as the dielectric separators found in such battery cells. The implementation of the disclosed principles in individual battery cells therefore provides an increased likelihood to mitigate catastrophic failures in batteries. In addition, the disclosed fabrication processes for printing sensors directly on the separators of each individual battery cell significantly reduce manufacturing steps required by conventional battery management systems. However, although every cell in a battery pack will have health monitoring using the printed sensors and gauges of the disclosed principles, the weight added to the overall battery pack will be negligible.

BRIEF DESCRIPTION OF THE DRAWINGS

The detailed description that follows, by way of non-limiting examples of embodiments, makes reference to the noted drawings in which reference numerals represent the same parts throughout the several views of the drawings, and in which:

FIG. 2A illustrates a sensor system formed on a Li-ion cell separator in accordance with the disclosed principles;

FIG. 2B illustrates a close-up view of a collection of FBG sensors from the sensor system of FIG. 2;

FIG. 6A illustrates another exemplary embodiment of Li-ion cell sensor system constructed in accordance with the disclosed principles;

FIG. 6B illustrates a close-up view of two of the collections of sensors from the sensor system in FIG. 6;

FIG. 14 illustrates a plot of viscosity vs. shear rate for a conventional photopolymer solvent alone and for an ink mixture of the photopolymer solvent with silica powder in accordance with the disclosed principles;

FIG. 17 illustrates a plot of viscosity vs. shear rate for a conventional photopolymer solvent alone, for an ink mixture of the photopolymer solvent with silica powder, and for an ink mixture of the photopolymer solvent, silica powder, and an alcohol-based agent, in accordance with another embodiment of the disclosed principles.

DETAILED DESCRIPTION

Figure 1:
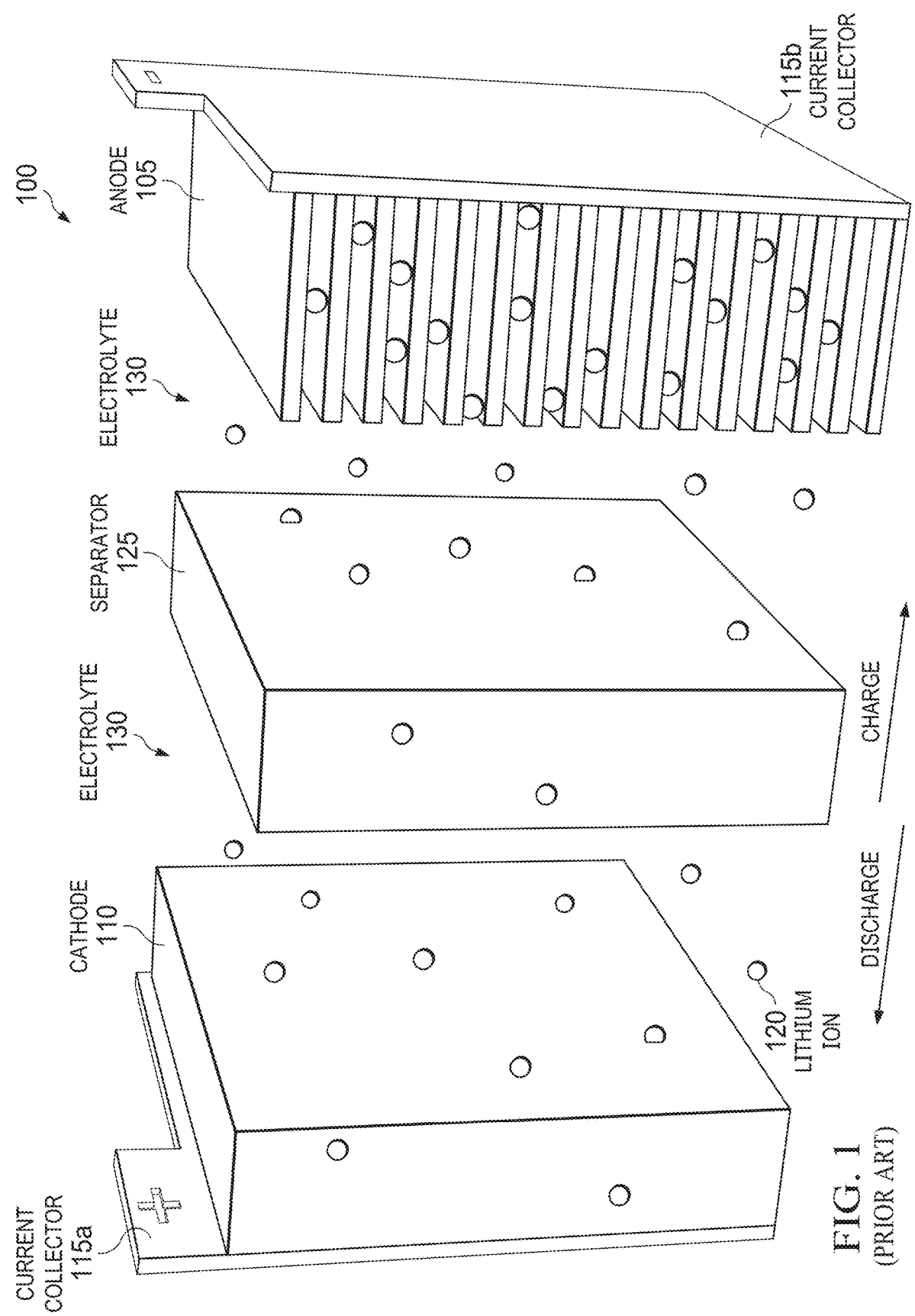
FIG. 1 illustrates a simplified diagram of the basic construction of a Li-ion cell.

In view of the foregoing, through one or more various aspects, embodiments and/or specific features or sub-components, the present disclosure is thus intended to bring out one or more of the advantages that will be evident from the description. The present disclosure makes reference to one or more specific embodiments by way of illustration and example. It is understood, therefore, that the terminology, examples, drawings and embodiments are illustrative and are not intended to limit the scope of the disclosure.

Fabrication Processes

To fabricate the exemplary sensors and gauges disclosed herein, two different exemplary 3D printing techniques may be used based on the deposition scale of interest. For features less than 300×300×80 microns nanoscribe technology may be used, and for features greater than 300×300×80 microns aerosol jet technology may be employed. Of course, it should be understood that no limitation to any particular printing or deposition technology is intended or should be implied from the teachings of the disclosed principles. Accordingly, the disclosed principles of embedding battery cell sensors/gauges by printing/depositing on the cell separators to create a battery management system capable of monitoring the state-of-health (SOH) and state-of-charge (SOC) of every cell within a battery pack may be accomplished using any advantageous technology, either now existing or later developed.

Nanoscribe technology—Fabrication of three-dimensional micro- and nanostructures in photo-sensitive materials is based on "direct laser writing", i.e., a non-linear two-photon absorption process. Many resins that polymerize when exposed to UV-light can undergo similar chemical reactions when two photons of near-infrared light are absorbed simultaneously. A necessary condition for this effect to occur is a sufficiently high light intensity that is provided by an ultrashort pulse laser. Typically, the laser is focused into the resin and the two-photon polymerization (TPP) is triggered only in the focal spot volume. As 3D analog on to a pixel, the volume counterpart is called voxel. For printed features with nanoscribe technology that need to retain conductive properties, traditional sputtering techniques can be used to metal-coat the printed features.

Aerosol Jet Technology—An environmentally benign, low-temperature, computer software driven aerosol 3D jet additive manufacturing process (such as the process developed by Optomec™ Maskless Mesoscale Material Deposition ($M^3D$) Aerosol Jet system) may be used. Aerosol 3D jet printing is maskless, non-contact additive manufacturing process that reduces the overall size of electronic systems by using nano-materials to produce fine featured circuitry and embedded components. The resulting functional electronics can have line widths and pattern features ranging from below 10 microns to as large as several millimeters as aerosol jet deposition utilizes an innovative aerodynamic focusing technology. The technique can directly deposit a wide range of commercial and custom electronic materials, including conductive nanoparticle inks, insulators, polymers, adhesives, dopants, etchants, and even biological materials on virtually any planar or non-planar substrate. The support of nanomaterials allows for low-temperature processing and ultra-thin layers (from 100 nm) where desired. In case of multilayer deposition, the process flow may consist of only a few steps, such as loading and then printing and processing the material until the final layer is deposited. The aerosol jet processes the material using liquid ink of a desired composition placed into an atomizer, creating a dense aerosol of tiny droplets between 1-5 microns in size. The aerosol is carried by a gas flow to the deposition head. The aerosol jet process begins with a mist generator that atomizes a source material. Particles in the resulting aerosol stream can then be refined in a virtual impactor and further treated on the fly to provide process flexibility.

Lithium-Ion Batteries

A lithium-ion (Li-ion) battery is a type of rechargeable battery in which lithium ions move from the negative electrode to the positive electrode during discharge and back when charging. Li-ion batteries use a lithium compound for the electrode material, where the electrolyte, which allows for ionic movement, and the two electrodes are the constituent components of a lithium-ion battery cell. A "cell" is a basic electrochemical unit that contains the basic components, such as electrodes, separator, and electrolyte. A "battery" or "battery pack" is a collection of cells which are ready for use, as it contains an appropriate housing, electrical interconnections, and possibly electronics to control and protect the cells from failure.

Regardless of the shape of the Li-ion battery comprising the cells, the basic architecture of each cells is the same. Specifically, each cell is constructed with two electrodes (i.e., an anode and cathode), which are kept electrically distinct from one another by a dielectric separator. The separator is typically a porous material whose pores permit ionic movement between the electrodes. FIG. 1 illustrates a simplified diagram of the basic construction of a Li-ion cell 100 in during both a charging and a discharging cycle. Each such cell 100 includes an anode 105 and a cathode 110, which comprise the electrodes of the cell. Electrically conductive current collectors 115a, 115b are coupled to the anode 105 and cathode 110, respectively. A separator 125 is placed between the electrodes 105, 110, and is comprised of a porous material that permits the lithium ions to pass from one electrode to the other. More specifically, during a charging state of the cell 100, the lithium ions 120 pass from the cathode 110 to the anode 105 through the separator 125, while during a discharge state, the ions pass from the anode 105 to the cathode 110 through the separator 125. An electrolyte material 130 is the medium through which the ions 120 travel, and due to lithium's reactivity with water, the electrolyte 130 is typically a non-aqueous material such as a mixture of organic carbonates. The disclosed principles provide sensor circuitry on the separator for each individual cell of a Li-ion battery or pack for real time monitoring of each cell's SOH.

Exemplary Embodiments

In one embodiment of a Li-ion cell sensor system in accordance with the disclosed principles, a collection of fiber Bragg grating (FBG) sensors is 3D printed onto the separator of each cell. An FBG is a type of distributed Bragg reflector constructed in a short segment of optical fiber that reflects particular wavelengths of light and transmits all other wavelengths. This is achieved by creating a periodic variation in the refractive index of the optical fiber's core, which creates a wavelength-specific dielectric mirror. An FBG can therefore be used as an inline optical filter to block certain wavelengths, or as a wavelength-specific reflector. In conventional battery monitoring approaches, thermal monitoring of Li-ion batteries is typically performed on their surface through the use of thermocouples or electro-mechanical sensors. Internal monitoring is also challenging due to the chemically aggressive and electrically noisy environment, for which sensors with low invasiveness, mechanical robustness, immunity to electromagnetic radiation, and resistance to corrosion, are required. Sensors based on fiber Bragg gratings are therefore an effective method to perform both static and dynamic measurements of temperature, pressure, strain, and other measurable parameters related to battery cell health and status.

FIG. 2A illustrates a sensor system 200 formed on a Li-ion cell separator in accordance with the disclosed principles. As discussed above, the separator 210 is formed from a porous material, which permits lithium ions to transfer through the separator 210 from one electrode to another in a Li-ion cell. An optical fiber 220 is formed on the surface of the separator 210, for example, using one of the 3D printing techniques discussed above. Thus, 3D structures comprising the disclosed sensors can be formed using in-situ ultraviolet (UV) light during printing with the selected 3D printing technique, and thus the material content is photopolymer-based so that can be instantly cured with the UV light. As the optical fiber 220 is 3D printed, FBG sensors are also created at select locations of the optical fiber 220, again using the 3D printing technique. Specifically, as seen in the close-up view of FIG. 2B, a first collection of FBG sensors 230 may be formed in the optical fiber 220 to function as sensors for generating data regarding temperature in the cell having the separator 210, while a second collection of FBG sensors 240 may be formed at a different location in the optical fiber 220 to function as sensors for generating data regarding a different parameter for the cell, such as strain. Likewise, a third collection of FBG sensors 250 may be formed in the optical fiber 220 to function as sensors for generating data regarding pressure or other parameter in the cell. Using this technique, multiple collections of sensors may be formed in the optical fiber 220 in a manner used to generate data regarding a measurable parameter of the cell that can be detected or measured due to its impact of an FBG-based sensor.

To measure a specific parameter, the FBG sensors detect changes in the selected parameters being monitored in the cell when input light from a light source travels through the optical fiber 220 to the various collections of FBG sensors formed in the fiber 220. That input light then interacts with the various sensors. Each collection of sensors (or a single sensor, if desired) is specifically configured to reflect a portion of the input light (at the Bragg wavelength for each sensor) thereby outputting light that changes in response to changes in a sensed parameter. For example, the characteristics of each FBG sensors will reflect a narrow wavelength of light when the cell exhibits a given collection of parameters. Thus, at a given temperature or pressure or other measurable parameter, the FBG sensors configured to measure each such parameter will reflect a given wavelength. However, as any of these parameters change, the periodicity of the grating and thus the refractive index of each FBG sensor configured to measure that parameter also changes, which results in a periodic change in the wavelength of light reflected by the sensors. The specific collection of FBG sensors can thus measure parameters such as temperature, strain, pressure, and displacement based on shifts in wavelength as each of these parameters changes in each cell during use of the battery comprising those cells. The output light is collected as measured to determine which wavelengths of remain. By determining what wavelengths of light remain in the light output from the optic fiber 220, changes in the selected parameters can be determined. Additionally, the printed FBG can measure internal voltage of the cell by having metal coating around the same location where the gratings are printed. The metal coating can be any precious metal inert to the reactive environment of the battery cell. Examples: platinum (Pt), or gold (Au). Aluminum (Al) could work as cheaper option too but might decompose at some point so is not the most reliable long term solution.

Figure 3:
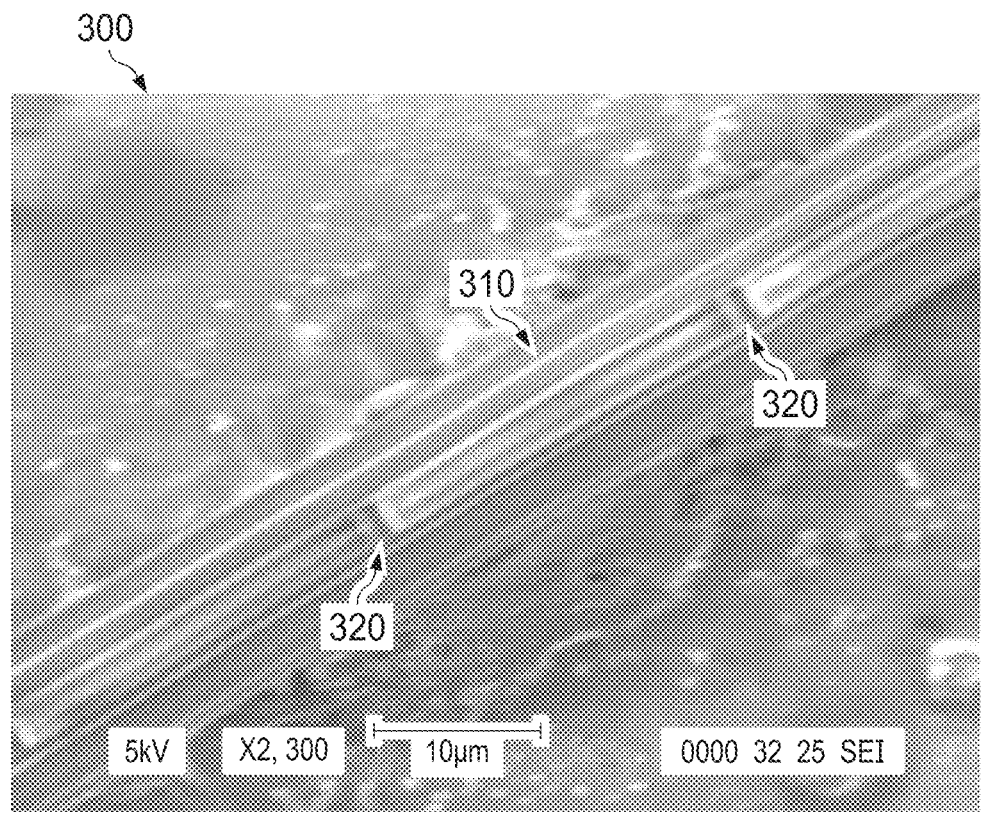
FIG. 3 illustrates an image taken using a scanning electron microscope of an optical fiber created in accordance with the disclosed principles using nanoscribe technology.

Each of the FBG sensors can be printed as described above by either of the fabrication processes discussed above, or by any process either now existing or later developed, and each sensor or collection of sensors is formed to have a particular Bragg wavelength as needed to measure a given parameter of the cell in which the optical fiber 220 is formed. Specifically, for each such collection of sensors to detect these different parameters, the 3D fabrication of each FBG comprising each sensor of each collection is thus altered to adjust the refracted wavelength of light. And through the disclosed principles, this is done using the same 3D printing technique used to print the optical fiber 220, allowing for a unique and quick creation of the entire sensor system on a cell separator 210, or other layer/component within the batter cell, capable of measuring multiple parameters used to calculate cell SOH in a single 3D fabrication process. FIG. 3 is an image 300 taken using a scanning electron microscope (SEM) of an optical fiber 310 created in accordance with the disclosed principles using nanoscribe technology. The optical fiber 310 was printed on a glass substrate, which can be employed as the dielectric material used as a separator in a Li-ion cell. The disclosed principles allowed the optical fiber 310 to be 3D printed with just a 10 micron diameter using a photo polymer-based material. FBG sensors 320 are also formed in the optical fiber 310 using the same technology for the 3D printing of the optical fiber 310.

In other embodiments, the fabrication of such an FBG sensor system in accordance with the disclosed principles may be 3D printing on a larger scale, if needed. For example, Aerosol Jet technology may be employed to form the same optic fiber and FBG sensor structure as described above, but where the optical fiber is 0.25 mm wide. In addition, the various FBG sensors for measuring various battery cell parameters are again formed within the optical fiber, but again at a larger scale. More specifically, for such Aerosol Jet deposition technique, three deposition layers were made, resulting in about 40 microns in thickness, with a step size of 50 μm and 5 mm/sec deposition speed. The flow parameters were set as 3, 1250 and 1300 ccm, with a standoff distance between the nozzle and substrate of approximately 4 mm.

Figure 4:
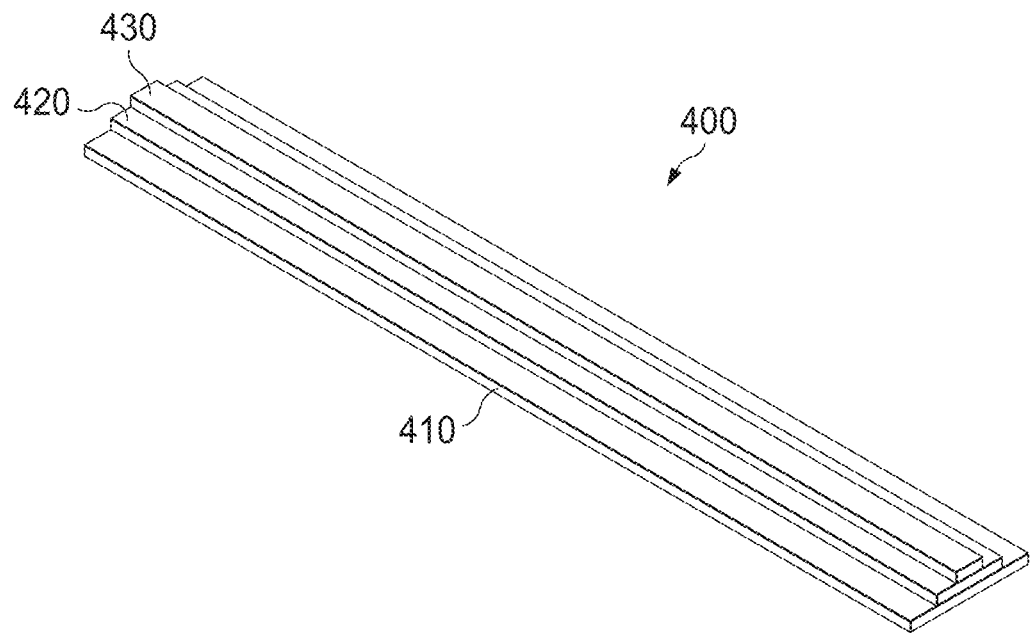
FIG. 4 illustrates an exemplary optical stack structure formed using a tape casting technique.
Figure 5:
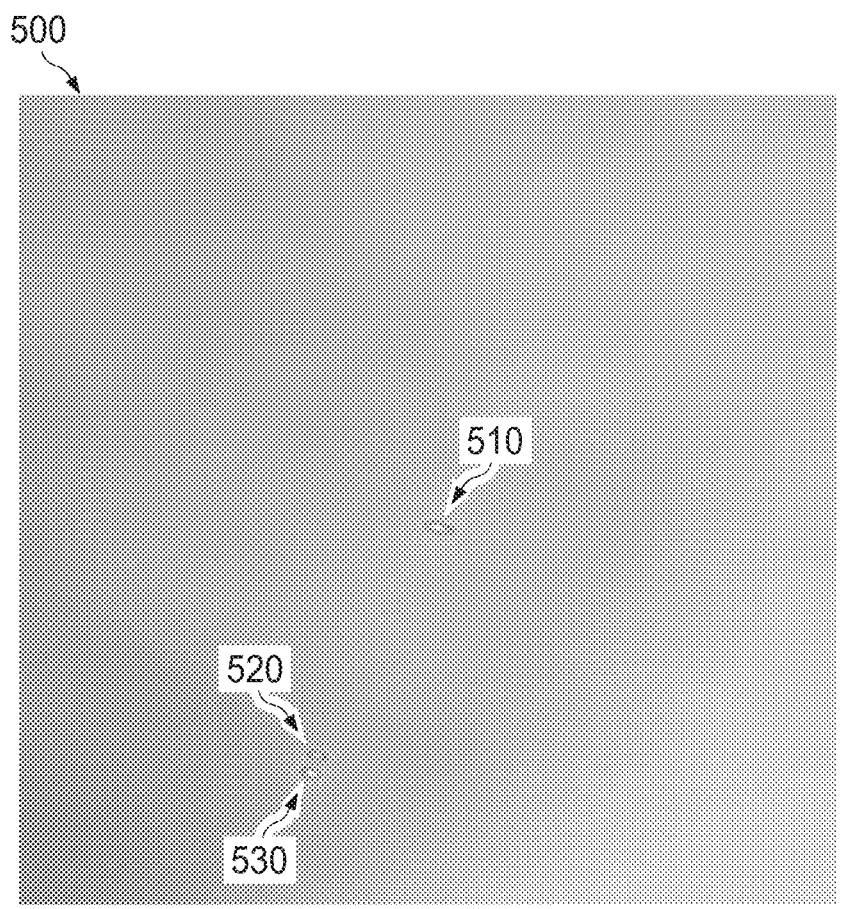
FIG. 5 illustrates an image of the strong light reflection from the exemplary optical stack structure of FIG. 4.

In yet other embodiments, for larger scale structures, the optical fiber and FBGs may be formed using a tape casting method, with an alternating material approach of two commercially available optical-based materials (e.g., Norland 71 and 84 produced by Norland Products, Inc. of New Jersey, USA). These materials each have a different refractive index, 1.56 for Norland 71 and 1.46 for Norland 84. Such an approach allows the printing of the FBGs in sensors measuring different parameters to be substantially the same for each FBG, but using different material to alter the wavelength of each particular FBG. Thus, not only do the disclosed principles allow for fabricating each parameter's sensor in a different structure from one another, sensor fabrication may be the same for all such sensors by alternatively changing the material used for printing each collection. Looking at FIG. 4, illustrated is an exemplary optical stack structure 400 formed using a tape casting technique. Three layers 410, 420, 430 equal in length with varying widths may be deposited on a substrate material, such as glass. In such embodiments, the first layer 410 on the bottom and the third, outermost layer 430 on the top may be formed from Norland 71 material, while the second, middle layer 420 is formed from Norland 84. The bottom layer 410 is formed with the largest width of the three layers, with the middle layer 420 having a lesser width, and then the top layer 430 having the least width. However, the difference in widths between the middle layer 420 and top layer 430 is approximately formed at one-half the difference in widths between the bottom layer 410 and middle layer 420. The deposition thickness of each layer 410, 420, 430 is kept substantially the same, and all three layers 410, 420, 430 were UV cured as deposited. By varying the widths of each layer, the step/grated pattern found in commercial FBG fibers are created. FIG. 5 illustrates an image 500 of the strong light reflection from the exemplary optical stack structure 400 of FIG. 4. The image 500 shows three dots of light 510, 520, 530 generated from input light passing through the three layers of the optical stack 400. The two dots 520, 530 appearing close together account for the two layers 420, 430 on top being very close in width, while the third dot 510 further away corresponds to the widest layer 410 on the bottom of the stack 400.

Turning now to FIG. 6A, illustrated is another exemplary embodiment of Li-ion cell sensor system 600 constructed in accordance with the disclosed principles. In this embodiment, the system 600 again includes optical fiber 610 printed or similarly deposited onto a dielectric separator 620 of a Li-ion cell. As with some of the other embodiments discussed above, the separator 620 is formed as a porous material. However, it should be noted that the disclosed principles encompass the 3D printing of the disclosed sensors and sensor systems on any layer or component in a cell, or even multiple components within the same cell. The optical fiber 610 is formed as a tall U-shape with its input and output ends reaching one edge of the separator 620.

Formed along the optical fiber 610 are multiple collections of FBG sensors, two of which are denoted as 630 and 640, formed in the optical fiber core to function as sensors for generating data regarding cell parameters, as discussed above.

Also printed on the separator 620 in accordance with the disclosed principles are conductors 650 and 660. To form the conductors 650, 660, each collection of FBG sensors 630, 640 is partially coated with conductive metal sleeves 650a, 660a using, for example, a sputtering process, and exemplary metals include platinum, aluminum or gold because they are inert to lithium-based environments. By first employing such metals to coat the collections of sensors 630, 640, the metal coating can provide voltage measurements across the sensor collections 630, 640. Electrically coupled to the metal sleeves 650a, 660a are conductive leads 650b, 660b. These conductive leads 650b, 660b also reach the edge of the separator 620, and are used to transmit readings from the sensor collections 630, 640, such as voltage detected, to cell monitoring equipment. As before, the disclosed 3D printing fabrication process can thus be employed to embed not only the optical fiber 610, but also the various sensor collections 630, 640, the metal sleeves 650a, 660a, and the conductive leads 650b, 660b, all within a single 3D printing process. FIG. 6B is an inset, close-up view of two of the collections of sensors 630, 640. Within each of the metal sleeves 650a, 660a, the four distinct FBG sensors 630a-d, 640a-d can be seen, although any number of sensors may advantageously be employed to determine the parameter data needed. As before, as the input light travels through the optical fiber 610, the various sensor collections formed in the fiber core will refract the light in various manners, and the refractive index of the FBG sensors can be selected as discussed above so as to detect various battery cell parameters, such as temperature, strain, pressure, or any other cell SOH parameter, either now employed in BMSs or later employed. The wavelengths of light detected from the light output from the optical fiber after encountering the various sensor collections can then be processed by cell monitoring equipment to determine each of the specific parameters for which sensors have been printed.

Figure 7:
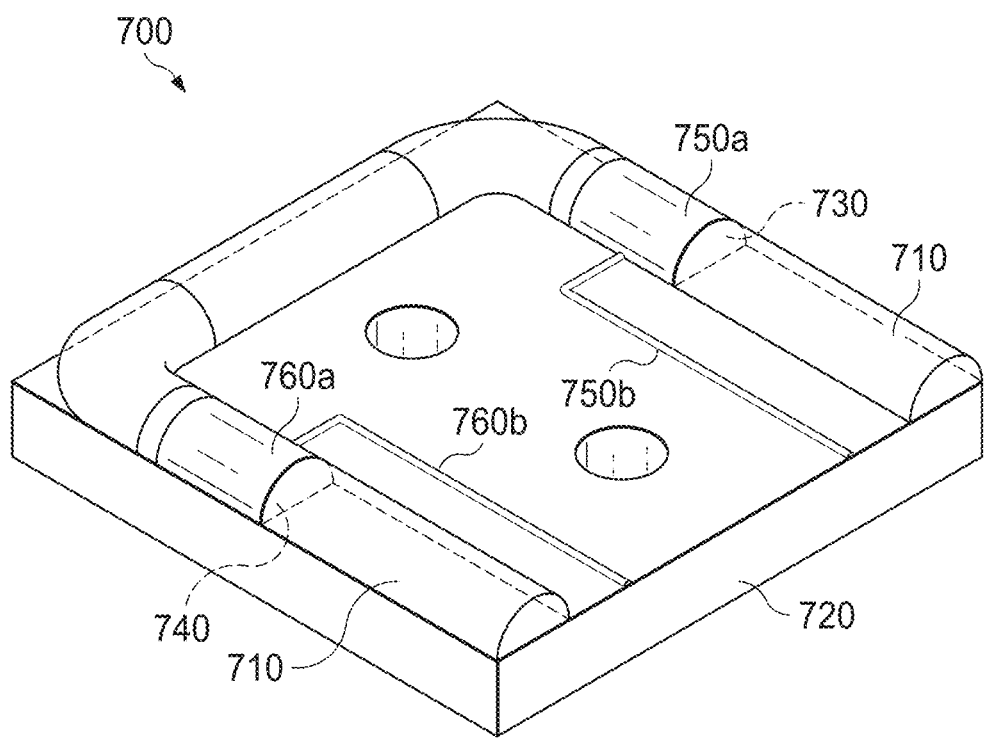
FIG. 7 illustrates an isometric close-up view of a portion of another exemplary Li-ion cell sensor system constructed in accordance with the disclosed principles.
Figure 8:
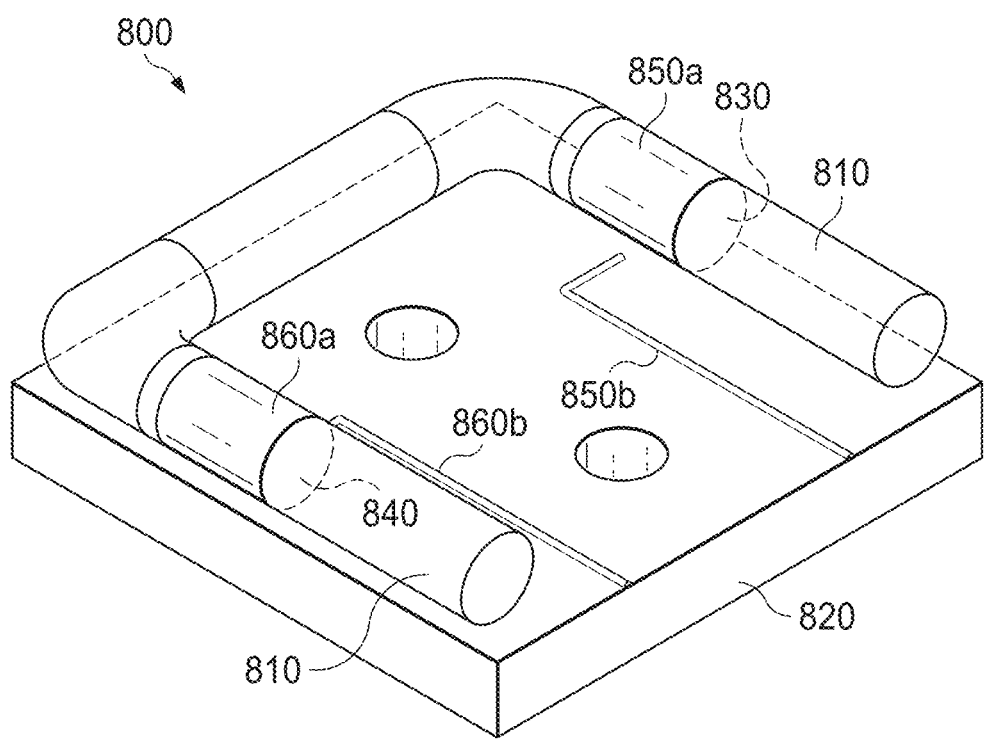
FIG. 8 illustrates an isometric close-up view of a portion of another exemplary Li-ion cell sensor system constructed in accordance with the disclosed principles, and similar to the system of FIG. 7.

FIG. 7 illustrates an isometric close-up view of a portion of another exemplary Li-ion cell sensor system 700 fabricated in accordance with the disclosed principles. As before, this exemplary system 700 includes an optic fiber 710 printed onto to a Li-ion cell separator 720. In this embodiment, the optical fiber 710 is printed having a semi-circular cross-section, as illustrated. FBG sensor collections 730, 740 are again formed in the optical fiber 710, and similarly have a semi-circular cross section. Conductive metal sleeves 750a, 760a are again deposited over the sensor collections 730, 740, with conductive leads 750b, 760b electrically coupled to the conductive metal sleeves 750a, 760a. FIG. 8 illustrates an isometric close-up view of a portion of another exemplary Li-ion cell sensor system 800 constructed in accordance with the disclosed principles, and similar to the system 700 of FIG. 7. Specifically, this exemplary system 800 again includes an optic fiber 810 printed onto to a Li-ion cell separator 820, as well as FBG sensor collections 830, 840 formed in the optical fiber 810. However, this embodiment differs from that of FIG. 7 in that the optical fiber 810 and sensor collections 830, 840 are printed having a fully circular cross-section, as illustrated. The particular shape of the optical fibers and FBG sensor collections may be selected based on the size and/or type of separator used for the cell. Thus, any advantageous shape may be employed, which could include not only the circular/cylindrical and semi-circular shapes discussed herein, but also triangular, conic and rectilinear shapes may also be employed. Conductive metal sleeves 850a, 860a may again be deposited over the sensor collections 830, 840, with conductive leads 850b, 860b electrically coupled to the conductive metal sleeves 850a, 860a. Both sensor systems in FIGS. 7 and 8 may again be embedded on cell separators using a single 3D fabrication process as disclosed herein, results in significantly simplifying and reducing the cost and time of fabricating BMS sensors in batteries.

Figure 9:
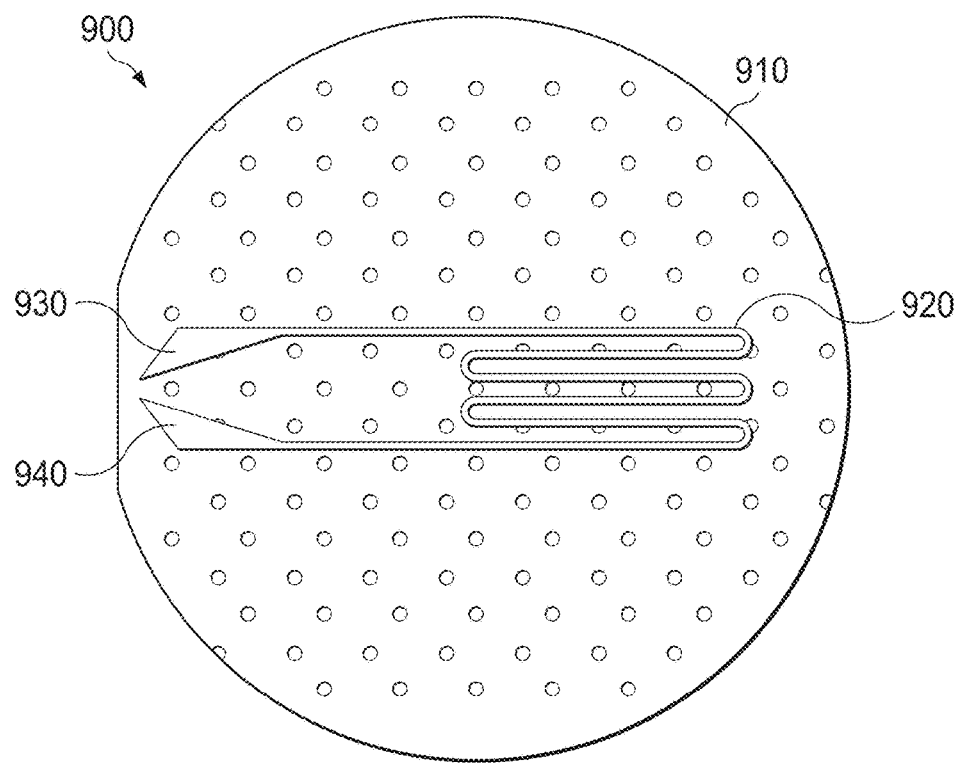
FIG. 9 illustrates one embodiment of a strain measurement system for a Li-ion battery cell constructed in accordance with the disclosed principles.

Turning now to FIG. 9, illustrated is one embodiment of a strain measurement system 900 for a Li-ion battery cell constructed in accordance with the disclosed principles. In this embodiment, a strain gauge is again printed onto a cell separator 910, but is not comprised of FBG sensors. Instead, to determine strain on the specific cell, the strain gauge is formed by printing a thin, e.g., about 1 micron in width, trace 920 on the separator 910. As with the optical sensors discussed above, the strain gauge may instead be formed on other appropriate layers or components of the cell as well.

Figure 10:
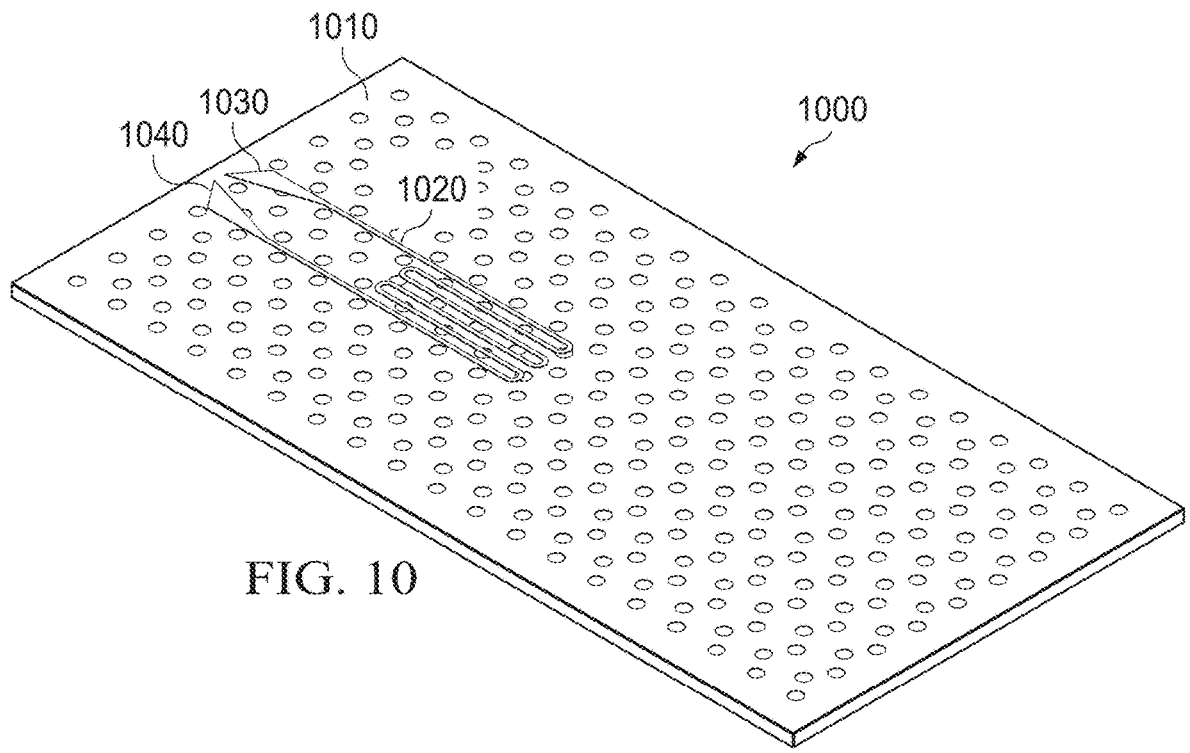
FIG. 10 illustrates another embodiment of a strain measurement system for a Li-ion battery cell constructed in accordance with the disclosed principles.
Figure 11:
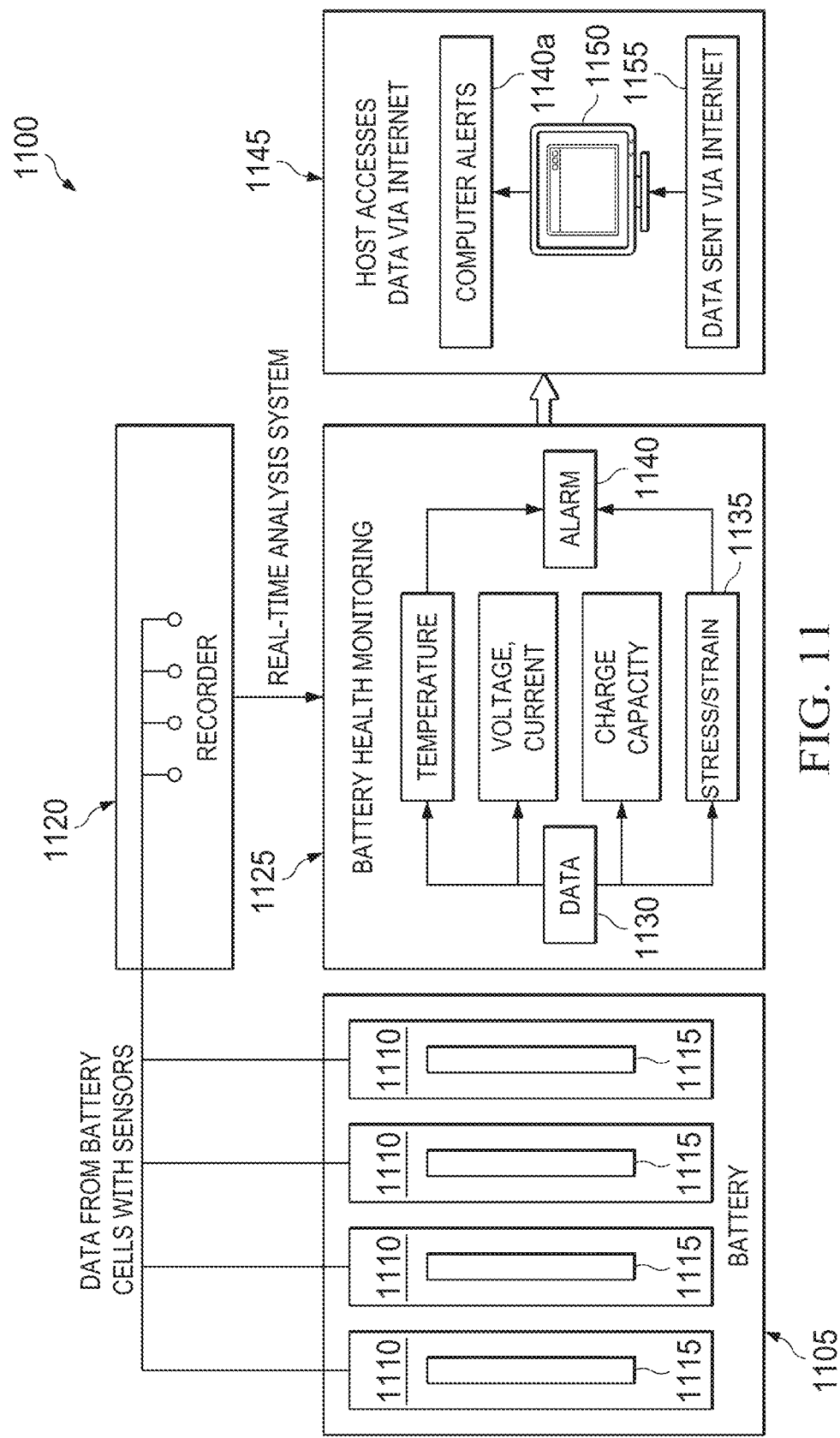
FIG. 11 illustrates a block diagram of a battery management system constructed and implemented in accordance with the disclosed principles.

To form the strain gauge, the trace 920 is then printed in a zig-zag pattern of parallel lines across an area of the separator 910 proximate the center and outer edge of the separator 910, as illustrated, since such strain gauges are more sensitive to strain put on the separator 910 along the lengths of the trace 920. In addition, the trace 920 is made electrically conductive by depositing a metal material over the trace 920. As before, exemplary metals may include platinum, aluminum and gold, since these metal are inert in a lithium-based environment. In addition, terminals 930, 940 are formed at the beginning and end of the conductive trace 920 using the same techniques. By forming the conductive trace 920 such that the longitudinal lengths of the trace 920 run back and forth across an area of the separator 910 that includes its center and near its edge, strain on the separator in the same direction may be detected. More specifically, as an electrical current is applied to the conductive trace 920 via the terminals 930, 940, the longitudinal lines of the trace 920 will have a given electrical resistance. However, if strain is applied to the separator 910 such that it begins to bend or other flex, so to do the longitudinal lines of the trace 920. As the longitudinal lines of the trace 920 so flex, their resistance will change, and detecting any such change in resistance of the longitudinal lines of the trace 920 will allow the measurement of strain on the separator 910, and thus on the cell. Importantly, the disclosed principles allow for the combination of such an embedded strain gauge with 3D printed embedded sensors of the type(s) disclosed herein. Moreover, the fabrication of both this type of strain gauge and the embedded sensors disclosed herein may be combined into a single 3D printing process. Thus, as before, using a single 3D fabrication process as disclosed herein, results in significantly simplifying and reducing the cost and time of fabricating BMS sensors in batteries Looking briefly at FIG. 10, illustrated is another embodiment of a strain measurement system 1000 for a Li-ion battery cell constructed in accordance with the disclosed principles. In this embodiment, a strain gauge is again printed onto a cell separator 1010. However, in this embodiment, the separator 1010 is a rectangular separator 1010, rather than the round separator 910 illustrated in FIG. 9 typically employed in coil style cells. Despite the printing of the strain gauge on a differently shaped separator 1010, the strain gauge is formed in the same manner as discussed above. In this embodiment, the conductive trace 1020 is again formed to cover an area of the separator 1010 that again includes coverage proximate to its center as well as proximate to its edge. Electrical terminals 1030, 1040 are again formed on the separator 1010 as well, to provide the electrical current to the strain gauge. Also as before, a single fabrication process may be employed as disclosed herein to form both the strain gauge and one or more embedded sensors on the same separator, significantly simplifying and reducing the cost and time of fabricating BMS sensors in batteries Implementation in Battery Management Systems Referring now to FIG. 11, illustrated is a block diagram of a battery management system 1100 implementing sensor systems fabricated in accordance with the disclosed principles. The system 1100 may be configured to provide both SOH and SOC information for every individual cell within a battery or battery pack with the disclosed embedded sensors. Battery management is thereby simplified and made interactive for a user through the use of a graphical user interface (GUI) receiving parameter data from embedded sensors 3D printed as disclosed herein.

The battery management system 1100 includes a battery 1105 being monitored, as described above. While a single battery 1105 is illustrated, it should be understood that multiple batteries may also be included in a management system implementing embedded sensors fabricated in accordance with the disclosed principles. The battery 1105 itself is comprised of multiple cells 1110, and again although only four cells 1110 are illustrated in FIG. 11, an advantageous feature of the disclosed principles is that any number cells may be monitored simultaneously and in real-time. To detect and collect charge and health data from each individual cell 1110, the dielectric separator 1115 within each cell 1110 is 3D printed with sensors fabricated as discussed in detail above on the separator 1115 of each individual cell 1110. Equipment within the system 1100 is configured to transmit light through the optical fiber(s) and 3D printing sensor(s) along the fiber(s), and determine cell parameters based on the shifts in wavelength of the transmitted light caused by the refractive index(es) of the sensor(s). The data collected by the received light transmitted through those embedded sensors can include real-time data regarding the temperature of each cell 1110, as well as the pressure and strain placed on each cell 1110. Moreover, the collected data can include voltage readings on each cell 1110 taken, for example, in the manner described above, as well as other parameter such as stress that can affect the SOC or SOH of a cell 1110. The system 1100 would thus include equipment configured to connect to the metal sleeves formed proximate the sensors along the optical fiber(s) and take measurements via those electrical interconnects. The detected and collected data from each of the cells 1110 may be gathered in a recorder 1120. The recorder 1120 may be comprised as a single or even multiple pieces of equipment, which may comprise both hardware and software. In some embodiments, the recorder 1120 may include a database for holding and storing the collected data, if desired, for later use in addition to the real-time use discussed herein.

Once the data is collected by the recorder 1120 from each of the sensors embedded in each of the cells 1110, that data may then be provided to an Analysis System 1125 in real-time. The Real-Time Analysis System 1125 is configured to compile the collected data 1130, and thereby determine the measurements for each applicable parameter of the cells 1110. More specifically, in this illustrated embodiment, the Analysis System 1125 is configured to determine, for each individual cell 1110, four SOH and SOC parameters 1135. For this embodiment, these include the temperature, voltage/current, charge capacity, and pressure for each cell 1110. Each of these parameters 1135 are continuously determined in real-time for each of the cells 1110 using the disclosed embedded sensor(s), and collectively they are used for health monitoring of the battery 1105. During such real-time measuring and determining of the parameters 1135 for each of the cells 1110, if any of the parameters 1135 for any particular cell 1110 is determined to be outside of a predetermined threshold for that parameter, the Analysis System 1125 may be configured to generate alarms 1140 to be provided to a user. Exemplary techniques for compiling the collected data to determine the parameters 1135 for each of the cells 1110 are discussed in further detail below.

A monitoring user 1145 may gain access to the results of the Analysis System 1125 via a host terminal 1155, which may be directly connected to the Analysis System 1125 or may be connected via a computer network, such as the Internet. In one such embodiment, the results provided by the Analysis System 1125 may be transmitted to the host terminal 1150 as data 1155 via the Internet or any type of data or computer network. The received data 1155 may then be displayed to the user on the host terminal 1150 using a GUI. As the information regarding the various parameters 1135, as well as any SOH or SOC information, are displayed on the GUI, the user may then interact with that information using the GUI. For example, using big data computing the user can be notified by the display on the GUI of early alert/warning sign(s) of degraded/risky cell then the user can shut down the system until the cell is repaired/replaced. To provide detailed information on the SOH of each of the cells 1110, the Analysis System 1125 provides the various parameter 1135 data determined for each cell 1110 to the host terminal. Traditionally, capacity and resistance have been used as the features to determine the SOH and SOC of lithium-ion batteries. In conventional approaches, influences such as temperature, stress/strain, vibration, and un-foreseen usage profiles inside the battery cell have been used to generate uncertain SOH predictions. In contrast, the disclosed principles provide for mathematical algorithms that use the parameter data generated by the presently disclosed embedded sensors to create a robust SOH model that will evaluate the health of each individual battery cell. For example, capacity, resistance, the length of time of a constant current, the length of time of a constant voltage, temperature over time, and strain over time may all used as additional indicators of SOH. Moreover, the accuracy of the SOH model(s) created using embedded sensors fabricated according to the disclosed principles increases with the increased number of measured parameters and calculated factors taken in consideration, in addition to the ability to gather data from every single cell. The collected parameter data and equations may then be integrated into a program for use with the user GUI, which accepts the data, processes the data using mathematical equations and models, and then generates the SOH status for each cell for display to the user.

Exemplary equations used in the advanced SOH prediction algorithm(s) that may employ data for the embedded sensors fabricated as disclosed herein are as follows. The SOH may be characterized by the Beta function with parameters $\alpha$ and $\beta$:

$$f_c(SOH; \alpha, \beta) = \frac{SOH^{\alpha-1}(1-SOH)^{\beta-1}}{B(\alpha, \beta)}$$

The parameters α and β are then updated by equating the mean of the Beta function to the weighted mean of the observed features:

$$\frac{\alpha}{\alpha+\beta} = \frac{\sum_{i=1:6} w_i F_i}{\sum_{i=1:6} w_i}$$

$$\alpha_c = \sum_{i=1:6} w_i^c F_i^c$$

$$\beta_c = \sum_{i=1:6} w_i^c (1 - F_i^c)$$

where the feature vector is:

$$F_i^c$$

and where c is the cycle number and i is the feature index. Then after each cycle, the weights are updated based on each feature's error from the previous SOH measurement:

$$w_i^{c+1} = w_i^c + (1 - |SOH_c - F_i^c|)$$

From these equations, an advanced modeling of the SOH of each cell may be created. For the constant current charging (CCCT) stage and capacity, which typically decrease as cycle number increases, the SOH is given by:

$$SOH = \frac{F_k}{F_{avg(1:5)}}$$

For the constant voltage charging (CVCT) stage and resistance, which generally increase as cycle number increases, the SOH is given by:

$$SOH = \left(\frac{F_k}{F_{avg(1:5)}}\right)^{-1}$$

Figure 12:
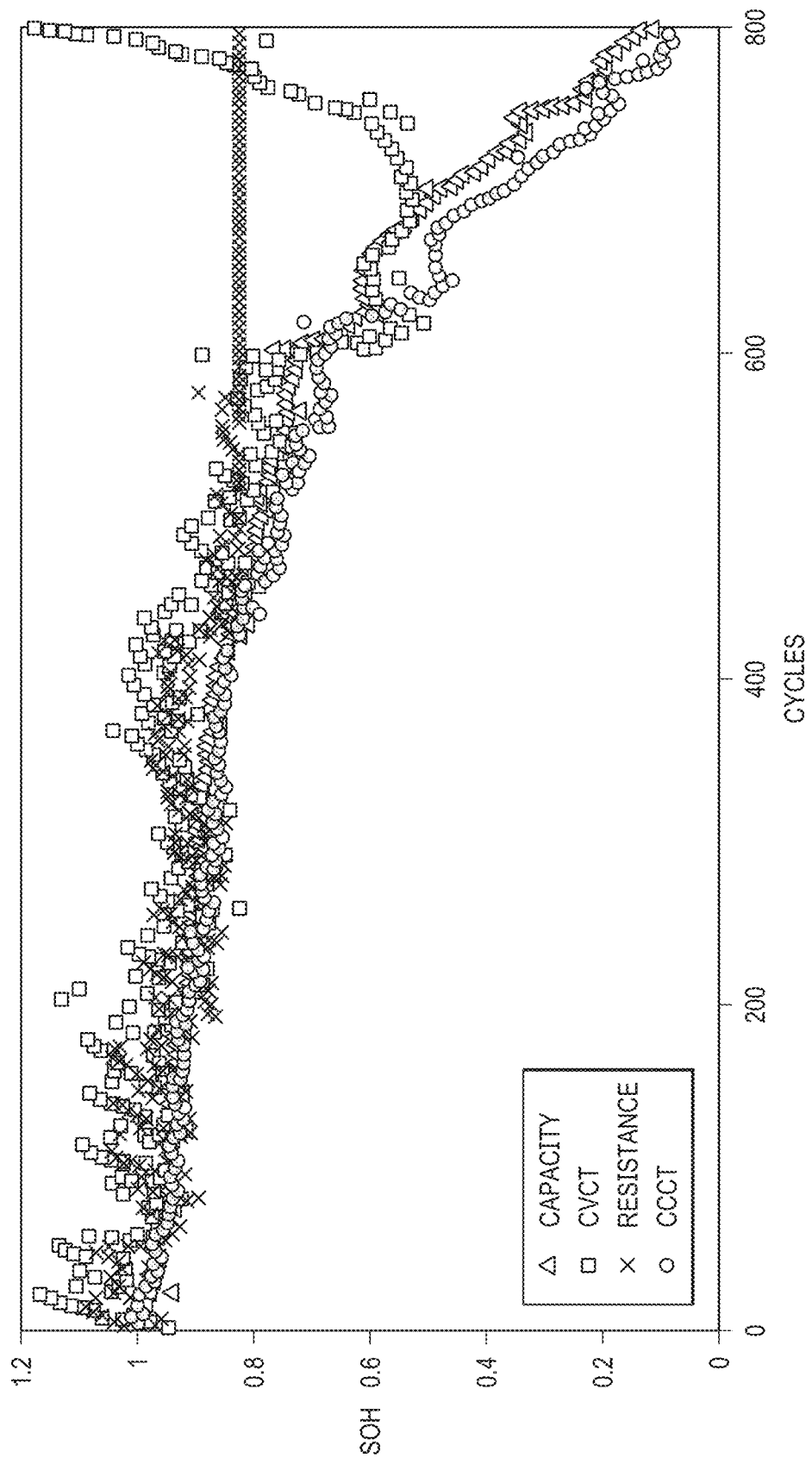
FIG. 12 illustrates a plot of the state-of-health (SOH) across charging cycles for each of capacity, CVCT, resistance and CCCT.

The capacity, the resistance, the time spent in the CVCT stage, and the time spent in the CCCT stage, are all extracted for the data after a full charge/discharge cycle. FIG. 12 illustrates a plot 1200 of the SOH across charging cycles for each of capacity, CVCT, resistance and CCCT. Note that the resistance and CVCT are inverted to ensure features are illustrated as degrading with increased cycling. The data is then fused to provide an estimated Final SOH for each battery. Specifically, the Final SOH prediction for each cell is taken as the value with the highest probability in the Beta distribution:

$$SOH_c = \operatorname{argmax}(f_c(SOH; \alpha, \beta))$$

Figure 13:
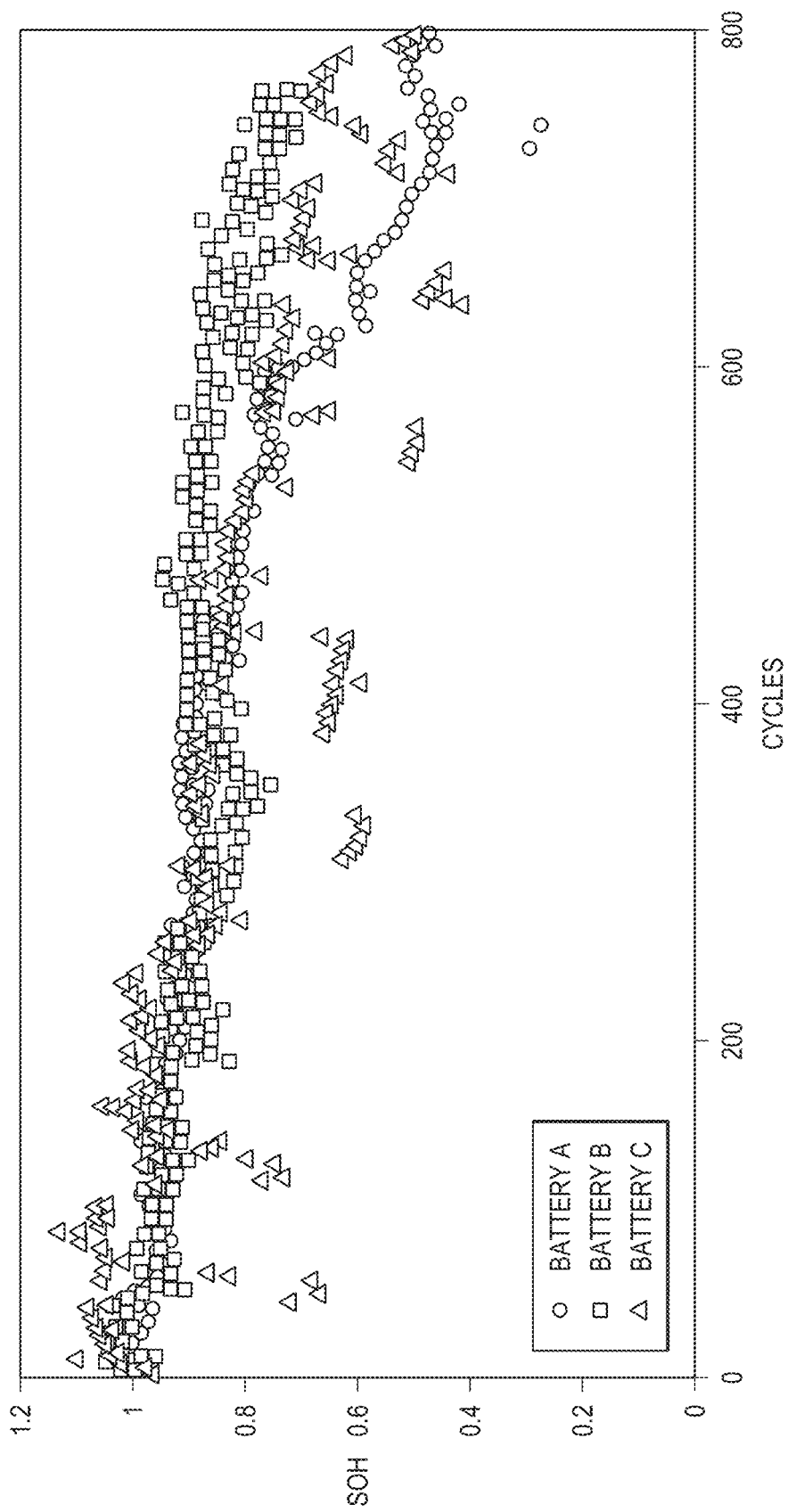
FIG. 13 illustrates a plot of the Final SOH across the cycle curves for three sample batteries having embedded sensors in each cell as disclosed herein.

Using this Final SOH prediction equation, FIG. 13 illustrates a plot 1300 of the Final SOH across the cycle curves for three sample batteries having embedded sensors in each cell as disclosed herein. However, using the disclosed 3D printing technique for embedding sensors in each cell separator, more accurate data is provided over conventional systems that measure less than all of the cells of a battery, or that measure merely the external parameters of a battery (i.e., surface temperature). Even as compared to conventional systems that attempt to provide sensors in each cell of a battery, the disclosed technique for embedding sensors is capable of obtaining the same amount of, or even more, data from each such cell since multiple sensors measuring or detecting multiple parameters can easily be provided by the disclosed fabrication technique. Moreover, such advantages are provided at a fraction of the cost and weight, and in a far less complex approach, than such conventional approaches.

In addition to the use of resistance, capacity, voltage and current parameters to generate the SOH models using the above equations, temperature and strain parameters may also be employed in developing SOH models. For example, with regard to strain on each cell, during each cycle the maximum, minimum, and range of strain data is collected. This data may also then be processed for used as a feature for SOH estimation:

$$f_1 = \left(\frac{\varepsilon_{max}^k}{avg(\varepsilon_{max}^{1:5})}\right)^{-1}$$

$$f_2 = \left(\frac{\varepsilon_{range}^k}{avg(\varepsilon_{range}^{1:5})}\right)^{-1}$$

Absolute max strain increases with age, so as before, the plot is inverted to illustrate a downward trend. The range decreases with age as the electrode(s) within the cell become unable to cycle as much lithium during each cycle. Similar equations may be developed for integrating temperature parameters as a feature for SOH estimation. The temperature follows continues increase trend as cycle number increases so it will use this equation:

$$SOH = \left(\frac{F_k}{F_{avg(1:5)}}\right)^{-1}$$

As such, as additional parameters are added to the SOH modeling technique disclosed herein to build an even more robust estimation of the SOH of cells and batteries.

In sum, the principles disclosed herein provide for the fabrication of compact and robust 3D printed sensing technology on the separator within each individual battery cell, and significantly reduce manufacturing steps for the embedding of FBG and other sensors and gauges inside one or more layers of the cells without any major hardware modifications. By embedding such sensors into each cell as disclosed herein, parameter and thus health monitoring of every cell of a battery pack is provided, versus the monitoring of a group of cells as found with conventional approaches. This is the case for even battery packs comprised of hundreds of cells. The benefit of an embedded sensor or collection of sensors in every cell is that it allows every cell to be monitored without having to provide a connection to all the battery terminals, which is impractical in battery packs consisting of hundreds of cells. Also, even as compared with conventional systems that attempt to provide sensors in each cell of a battery, by simply printing and depositing multiple sensors and gauges configured to measure a variety of SOH parameters directly on the Li-ion separators or other advantageous component as disclosed herein, provide additional parameter data over systems that may measure every cell of a battery, but are limited in what parameters can be monitored for each cell by the size, cost and/or weight of conventional sensors or sensor systems. And the cost for providing such additional monitoring of every cell of an embedded sensor system as taught herein is a fraction of the cost for conventional battery management systems no matter how many cells such conventional sensor systems can monitor. Moreover, although every cell in a battery pack will have health monitoring using the printed sensors and gauges of the disclosed principles, almost any weight added to the overall battery pack will typically be negligible. Only the weight of the printed materials used to form the sensors and gauges is added to the pack, which is only a marginal increase in overall pack weight. Still further, monitoring and maintenance of every cell in accordance with the disclosed principles is done in real-time, and allows for the calculating, as well as the modeling for presenting to a user, of not only the SOH of each individual cell, but also the Final SOH of the battery pack comprising those cells. By determining the SOH of cells and battery packs in the disclosed manner, faults can be mitigated and flammability of battery eliminated with minimal to no uncertainty since every cell is monitored individually, and this is done so in a much simpler, faster, less expensive, and with less weight than the same determination of SOH by conventional systems.

Silica-Based Ink

In addition to the disclosed technique of embedding 3D printed sensors on one or more layers within battery cells, there may still be issues that arise with 3D printing with such cells. Specifically, some of the problems that can arise with such printing of embedded sensors include the highly volatile environment that often occurs within lithium-ion cells. In addition, lithium-ion battery cells need to be hermetically sealed for good performance, and in most implementations the surface area(s) suitable for the 3D printing of the disclosed embedded sensors is quite small. Each of these factors weigh on not only the type of 3D printing technology that may be employed in accordance with the disclosed sensor embedding technique, but also the type of ink that may be used for this 3D printing of sensors.

As discussed above, aerosol jet technology can provide 3D printing of disclosed sensor components on the order of just a few microns in size. However, the volatile nature inside the battery cells remains a concern. In accordance with the principles disclosed above, optical based sensors are embedded on one or more of the layers within the battery cells since optical-based sensors have inert properties that will not react with the internal cell environment. However, conventional inks suitable for aerosol jet printing technology do not have sufficiently viable optical properties for use in creating the embedded optical-based sensors disclosed herein. Moreover, aerosol jet 3D printing is a non-contact process capable of printing nano-ink patterns on conformal and flexible surfaces. Aqueous or solvent nano-inks are pneumatically atomized by the flow of nitrogen gas. The flow of atomizing gas into and out of the cup leads to evaporation and removal of volatile solvent(s). As the solid loading fraction of the ink increases, the rheological changes can lead to instabilities and non-uniformity in the print output. Therefore, the quality of the deposition highly depends on the quality of the ink in addition to the optimization of printing parameters.

To address these concerns of nano-size patterns and the deficiencies of conventionally available 3D printing inks, the disclosed principles further provide a silica-based ink comprising silica ($SiO_2$) powder that can be used in the manufacturing process of the disclosed optical sensors and any other embedded components that not only require inert properties, but that provides a sufficient level of optical properties so that the embedded sensors can sufficiently function as optical sensors. While a variety of different materials can be 3D printed with the aerosol jet deposition technology, for good quality deposition specific for use as optical sensors as disclosed herein, the ink must be optimized before used in the sensor manufacturing process(es) discussed herein. For example, conventionally available nano-inks on the market and capable of deposition using aerosol jet technology include metal-, non-metal-, dielectric-, adhesive-, and semiconductor-based inks. However, none of these inks provide the sufficient optical properties for use with the embedded sensors of the disclosed principles, while maintaining high quality deposition detail.

Moreover, in order to build the 3D optical-based structures disclosed herein with aerosol jet additive manufacturing technology in-situ during the battery cell manufacturing process, UV curing of the 3D deposited material is an advantageous property. Therefore, in the development of the disclosed inks one of the requirements was to include a photopolymer based solvent that allows in-situ curing of the deposition to be very fast, as well as provide optical properties needed for the 3D printed optical fibers and sensors disclosed herein. Indeed, selected photopolymer solvents for use in silica-based inks according to the disclosed principles ideally should have greater photo properties than polymer based properties.

An exemplary ink mixture according to the disclosed principles contains silicon dioxide ($SiO_2$), also called "silica," added to the photopolymer solvent. It is commonly known that silica is used to form glass and other objects that have excellent optical properties, as needed for the optical-based sensors disclosed herein. However, while the optical properties of an ink entirely made from silica would certainly be advantageous from an optical property view, silica alone is not readily deposited using any 3D printing technology, and furthermore does not cure in an in-situ process. This is the case because in its natural state, silica exists as a solid powder. Thus, a solvent is added to the disclosed silica-based ink recipes to permit 3D printing with the mixture, as well as in-situ curing of the printed optical elements disclosed above. However, simply adding a photopolymer solvent is not sufficient. More specifically, for use in aerosol jet 3D printing equipment, a specific viscosity for the ink is preferred and advantageous at the range between about 75-100 cP (centipoise). Although aerosol jet printing equipment may typically handle viscosities up to 1000 cP, the disclosed range of viscosities of the disclosed silica-based ink has been shown to achieve excellent results within the range of 50-200 cP. Accordingly, not only must minimum optical properties be maintained for the printed optical elements to function as sensors as disclosed herein, but a precise range of viscosity for the ink must be maintained while also permitting in-situ curing of the printed structures so as not to overly delay the battery cell manufacturing process when the disclosed sensors are embedded.

In one embodiment of a silica-based ink, the disclosed principles combine about 2% weight by volume of silica with 98% photopolymer solvent having an individual viscosity of about 30-55 cP (typically a measured average of 45 cP). For example, in one exemplary mixture, 49 g of commercially available solvent NOA 84 was combined with 1 g of silica powder. Since silica is a solid powder, its addition to a solvent will raise the solvent's initial viscosity significantly. In this exemplary mixture, for each 1 g of silica powder added to the 49 g of this particular solvent, the viscosity of the ink mixture was raised to about 86 cP. FIG. 14 illustrates a plot 1400 of viscosity vs. shear rate for both the NOA 84 solvent alone and a mixture of this photopolymer solvent with silica powder in these proportions. From the measurements plotted in FIG. 14, it is demonstrated that even though silica is introduced to the solution and it doubles the initial viscosity of the solvent to about 86 cP, the resulting viscosity of this exemplary ink mixture is viable for 3D printing with the aerosol jet additive manufacturing process discussed herein. Additionally, such components can be slightly altered to tailor the final ink mixture with varying amounts of silica for other applications, but still useable with aerosol jet deposition equipment by keeping the ink mixture at a useable final viscosity.

Sample depositions were made using glass as a substrate for both the NOA 84 solvent alone and for the disclosed ink mixture using the same proportion of silica in order to compare the viability of the two inks. Operating parameters for the aerosol jet equipment were: step size of 50 µm, 7 mm/s deposition speed, flow parameters set as 3, 1250, 1300 ccm, standoff distance between the nozzle and substrate at approximately 4 mm, and a nozzle size of 200 microns. As an initial distinction, the disclosed silica-based ink was deposited in three layers, with each of the three layers UV-cured immediately after deposition in order to achieve a final thickness of 30 microns. The NOA 84 alone was also deposited on a glass substrate using same operating parameters, but was not immediately curable as discussed above. Characteristics of both depositions were examined and are discussed below.

Figure 15A:
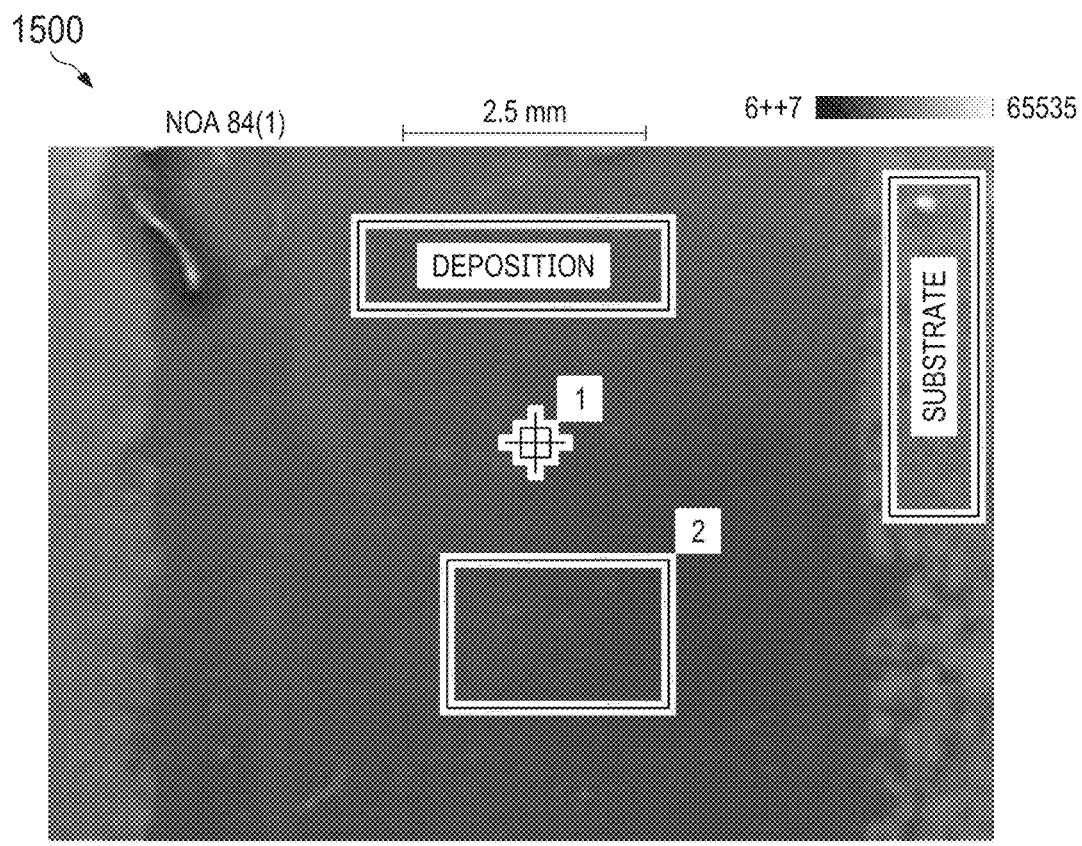
FIG. 15A illustrates a scanning electron microscope image of the photopolymer solvent deposition alone.
Figure 15B:
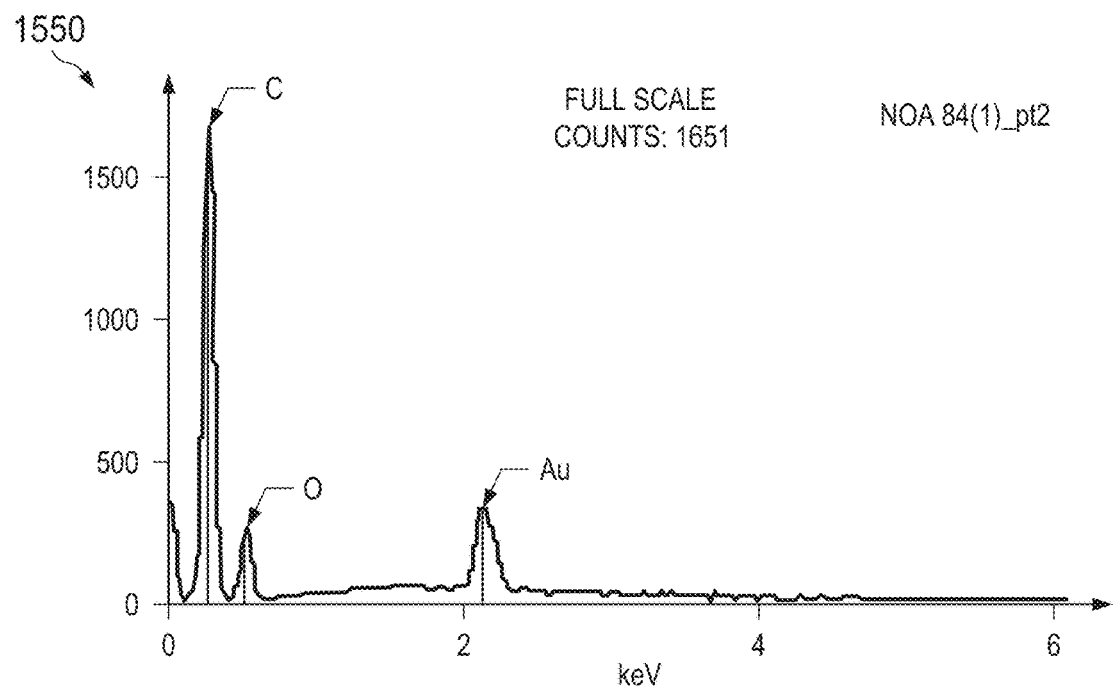
FIG. 15B illustrates an electron dispersive spectroscope analysis graph of photopolymer solvent deposition of FIG. 15A.
Figure 16A:
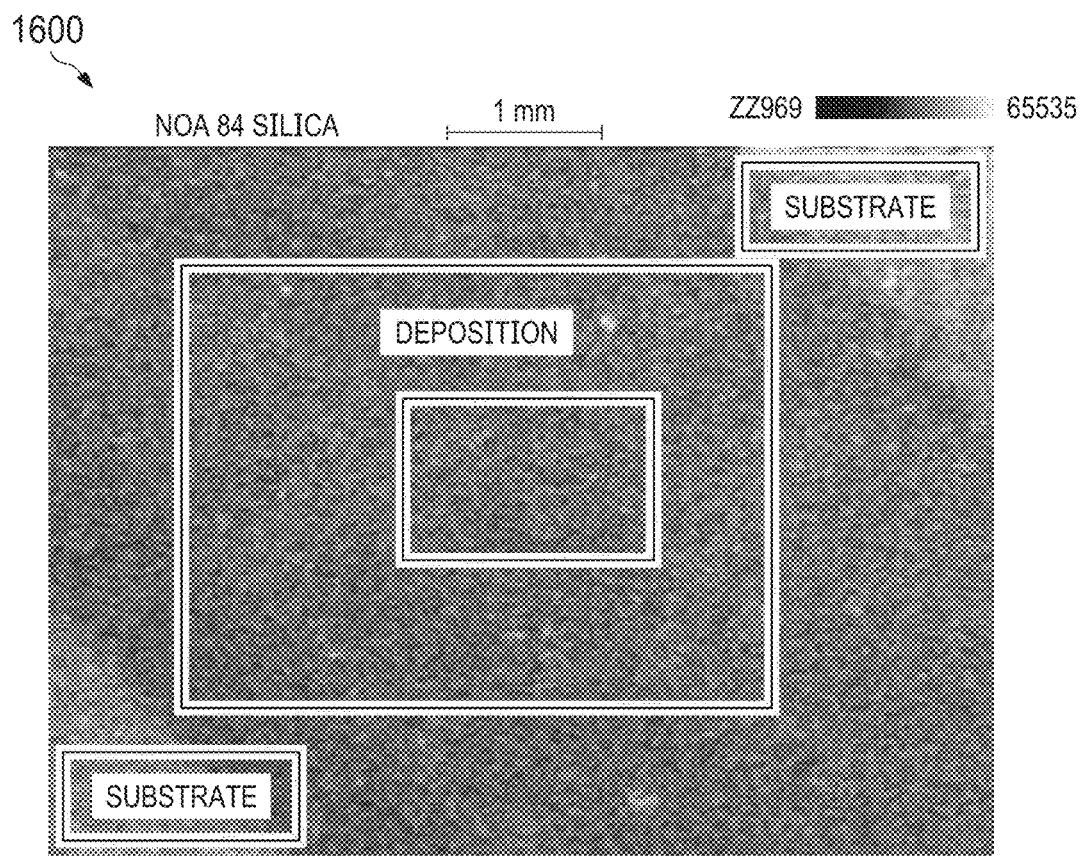
FIG. 16A illustrates an SEM image of an ink mixture of the photopolymer solvent of FIGS. 15 and 15B combined with silica powder in accordance with the disclosed principles.
Figure 16B:
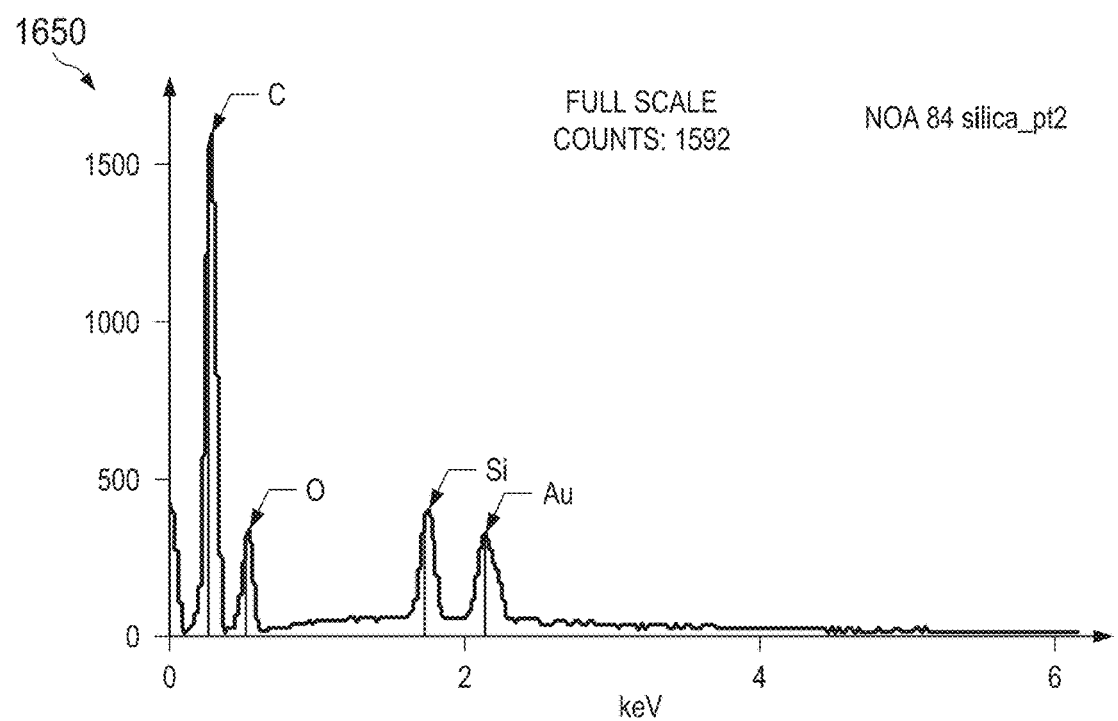
FIG. 16B illustrates an electron dispersive spectroscope analysis graph of silica-based ink mixture deposition of FIG. 16A.

FIG. 15A provides a scanning electron microscope (SEM) image 1500 of the NOA 84 deposition alone, which shows the expected uniform topology of the solvent alone. FIG. 15B provides an electron dispersive spectroscope (EDS) analysis graph 1550 of NOA 84 deposition alone, which reveals the carbon (C) and oxygen (O) components of the deposited solvent. However, despite the uniform topography, the optical properties of the solvent alone is not sufficient for use as the optical elements disclosed herein. FIG. 16A provides an SEM image 1600 of the disclosed ink mixture of the NOA 84 with silica powder, again in the proportions discussed above. Advantageously, this SEM image 1600 reveals the disclosed ink mixture maintains a uniform topography, although with the silica powder evenly disbursed throughout the deposition. The uniform disbursement of the silica within the solvent provides a uniform increase in the optical properties above the NOA 84 solvent deposition alone, despite both depositions providing for a uniform distribution and topography. FIG. 16B provides an EDS analysis graph 1650 of the disclosed ink mixture of NOA 84 mixed with silica, and the presence of the silicon (Si) is confirmed by the Si pick in the EDS scan. It is noted that both EDS analyses (1550, 1650) demonstrate gold (Au) picks, and these are a result of very thin gold layer deposited on each sample by sputtering technique in order to be able to view the samples under SEM. However, the presence of the gold can be omitted as far as sample quality and content is concerned.

In other embodiments of silica-based ink mixtures created in accordance with the disclosed principles, an alcohol-based agent may be added to the ink mixture. In such exemplary embodiment of a silica-based ink, the disclosed principles combine 49 g of NOA 84 solvent with 1 g of silica powder, and with the addition of 10 g of Terpineol as the alcohol. Thus, the alcohol in this embodiment comprises about 16.67% weight by volume of ink mixture. As discussed above, the addition of silica to the HOA 84 solvent raises the solvent's initial viscosity significantly. But then the further addition of Terpineol, or any other appropriate alcohol-based agent, will decrease the overall viscosity of the ink mixture. As a result, the amount of alcohol used in a given silica-based ink mixture as disclosed herein may be adjusted so as to adjust the overall viscosity of the ink mixture. In this exemplary mixture, since the same 1 g of silica powder is added to the same 49 g of NOA 84 is used, the viscosity of the ink mixture is about 86 cP before the addition of the alcohol. Then after the addition of the 10 g of Terpineol, the final overall viscosity of the resulting disclosed ink mixture is about 65 cP. Stated another way, in this exemplary ink mixture, the total of 60 g of mixture comprises about 81.667% NOA 84 (49 g), about 1.667% silica powder (1 g), and about 16.667% Terpineol (10 g). Such ability to decrease the viscosity of the final ink mixture in the disclosed manner is advantageous in cases where processing techniques other than aerosol jet are employed.

FIG. 17 illustrates a plot 1700 of viscosity vs. shear rate for the NOA 84 solvent alone, the above-discussed ink mixture of this photopolymer solvent with silica powder in the above-mentioned proportions, and then an ink-based mixture adding 10 g of Terpineol to the initial silica-based mixture. From the measurements plotted in FIG. 17, it is demonstrated that the alcohol-based agent added to the silica-based mixture results in an overall viscosity of about 65 cP. Additionally, the substantially uniform viscosity of this alcohol-added silica-based ink mixture across the range of shear rate is a further advantageous characteristic. Also, the amount of Terpineol, or other alcohol-based agent, may be adjusted to again tailor the desired viscosity of the silica-based ink mixture. For example, if increased optical properties are desired above the exemplary mixtures discussed above, additional silica powder may be added to the same photopolymer solvent. However, while the density of silica disbursed throughout the mixture increases, thus increasing optical properties, such increase in silica proportionally increases the overall viscosity of the ink mixture. Accordingly, the amount of Terpineol may also be increased to bring the overall viscosity of the ink mixture back down to a desired level.

In the numerous embodiments of the inventive subject matter disclosed herein, such embodiments may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

It is submitted with the understanding that it will not be used to interpret or limit the scope or meaning of any claims issuing from this disclosure. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as any such issuing claims reflect, inventive subject matter lies in less than all features of a single disclosed embodiment.

The description has made reference to several exemplary embodiments. It is understood, however, that the words that have been used are for description and illustration, rather than words of limitation. Changes may be made within the purview of the appended claims, as presently stated and as amended, without departing from the scope and spirit of the disclosure in all its aspects. Although this description makes reference to particular means, materials and embodiments, the disclosure is not intended to be limited to the particulars disclosed; rather, the disclosure extends to all functionally equivalent technologies, structures, methods and uses such as are within the scope of any claims issuing from this disclosure.

The invention claimed is:

1. A method of forming a battery cell monitoring system, the method comprising:
   forming an optical fiber on a component within the battery;
   forming at least one fiber Bragg grating (FBG) sensor along the optical fiber by creating a periodic variation in the refractive index of the optical fiber; and
   ultraviolet (UV) light-curing the optical fiber after its forming;
   wherein the optical fiber is configured to receive transmitted light therethrough, and configured to emit light therefrom with one or more shifts in wavelength caused by refraction of the transmitted light by the at least one FBG sensors.

2. The method in accordance with claim 1, wherein forming the optical fiber comprises forming the optical fiber directly on a dielectric separator of the battery cell.

3. The method in accordance with claim 1, wherein forming the optical fiber and the at least one FBG sensor comprises forming via 3D printing.

4. The method in accordance with claim 3, wherein the 3D printing comprises employing aerosol jet technology.

5. The method in accordance with claim 1, further comprising forming at least two metal sleeves on the optical fiber proximate ones of the FBG sensors, the at least two metal sleeves configured to detect an internal voltage of the cell.

6. The method in accordance with claim 5, further comprising forming corresponding conductive leads in contact with the at least two sleeves, the conductive loads configured to permit voltage measuring across the FBG sensors via the corresponding metal sleeves.

7. The method in accordance with claim 6, wherein forming the at least two sleeves and corresponding conductive leads comprises forming 3D printing.

8. The method in accordance with claim 1, further comprising transmitting the light using battery cell monitoring equipment coupled to the optical fiber, and receiving the emitted light into the battery cell monitoring equipment, the method further comprising measuring, using the battery cell monitoring equipment, parameters of the battery cell based on the one or more shifts in wavelength caused by refraction of the transmitted light by the at least one FBG sensors.

9. The method in accordance with claim 8, wherein the measuring comprises measuring one or more of battery cell temperature, strain, pressure. and displacement based on said one or more shifts in wavelength.

10. The method in accordance with claim 1, wherein. forming an optical fiber comprises forming an optical fiber comprising a cured mixture comprising photopolymer and silica.

11. The method of forming a battery cell monitoring system, the method comprising:
    forming an optical fiber directly on dielectric component within the battery cell;
    forming at least one fiber Bragg (FBG) sensor along the optical fiber by creating a periodic variation in the refractive index of the optical fiber;
    ultraviolet (UV) light-curing the optical fiber after its forming;
    transmitting light through the optical fiber and the at least one FBG sensor;
    emitting light from the optical fiber, the emitted light having with one or more shifts in wavelength caused refraction of the transmitted light by the at least one FBG sensors; and
    measuring parameters of the battery cell based on the one or more shifts in wavelength caused by refraction of the transmitted light by the at least one FBG sensors.

12. The method in accordance with claim 11, wherein forming the optical fiber and the at least one FBG sensor comprises forming via 3D printing.

13. The method in accordance with claim 12, wherein the 3D printing comprises employing aerosol jet technology.

14. The method in accordance with claim 11, further comprising forming at least two metal sleeves on the optical fiber proximate ones of the FBG sensors, the at least two metal sleeves configured to detect an internal voltage of the cell.

15. The method in accordance with claim 14, further comprising forming corresponding conductive leads in contact with the at least two sleeves, the conductive leads configured to permit voltage measuring across the FBG sensors via the corresponding metal sleeves.

16. The method in accordance with claim 15, wherein forming the at least two sleeves and corresponding conductive leads comprises forming via 3 D printing.

17. The method in accordance with claim 11, wherein the measuring comprises measuring one or more of battery cell temperature, strain, pressure, and displacement based on said one or more shifts in wavelength.

* * * * *